(12) United States Patent
Hirose et al.

(10) Patent No.: US 6,554,010 B1
(45) Date of Patent: Apr. 29, 2003

(54) SUBSTRATE CLEANING TOOL, HAVING PERMEABLE CLEANING HEAD

(75) Inventors: Keizo Hirose, Kofu (JP); Kenji Sekiguchi, Kofu (JP); Tomohide Inoue, Kurume (JP); Takanori Miyazaki, Kumamoto (JP); Kinya Ueno, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 247 days.

(21) Appl. No.: 09/626,162

(22) Filed: Jul. 26, 2000

(30) Foreign Application Priority Data

Jul. 26, 1999 (JP) .............................. 11-211358

(51) Int. Cl.⁷ .................... B08B 3/00; A47L 25/00
(52) U.S. Cl. .................. 134/153; 134/902; 15/77; 15/88.2; 15/102
(58) Field of Search ............... 134/153, 157, 134/902; 15/77, 88.1, 88.2, 102

(56) References Cited

U.S. PATENT DOCUMENTS

| | | | |
|---|---|---|---|
| 4,811,443 A | | 3/1989 | Nishizawa .................. 15/97.1 |
| 5,647,083 A | * | 7/1997 | Sugimoto et al. ............ 15/21.1 |
| 5,906,687 A | | 5/1999 | Masui et al. ................. 134/1.3 |
| 6,175,983 B1 | * | 1/2001 | Hirose et al. ................. 15/102 |
| 6,412,134 B1 | * | 7/2002 | Oikawa ........................ 15/102 |

FOREIGN PATENT DOCUMENTS

| | | | |
|---|---|---|---|
| JP | 10092780 A | * | 4/1998 |
| JP | 2875213 | | 1/1999 |

* cited by examiner

Primary Examiner—Randy Gulakowski
Assistant Examiner—Joseph Perrin
(74) Attorney, Agent, or Firm—Smith, Gambrell & Russell, LLP

(57) ABSTRACT

In a cleaning apparatus for substrates, such as semiconductor wafers, a permeable core member 68 made of a synthetic resin is supplied with distilled water from a distilled water supply path 60 within a head portion 66 of a cleaning tool 24. A planar portion 72 is provided on the lower surface of the core member 68 and a porous resin sheet 69 is attached to the outer surface of the core member 68, to cover it. The cleaning tool 24 is provided with an air bearing cylinder 30 that imparts a vertical driving force to a rod 31 that presses against the surface of a wafer W which is being rotated, and the distilled water supply path 60 is provided within the rod 31. The distilled water supplied from the distilled water supply path 60 permeates through the core member 68 and the porous resin sheet 69 and is sent out of the head 66 so that a flowing film of distilled water is formed on the surface of the wafer W. Thus contamination and damage of the substrate is prevented and the shape of the head is not destroyed.

21 Claims, 22 Drawing Sheets

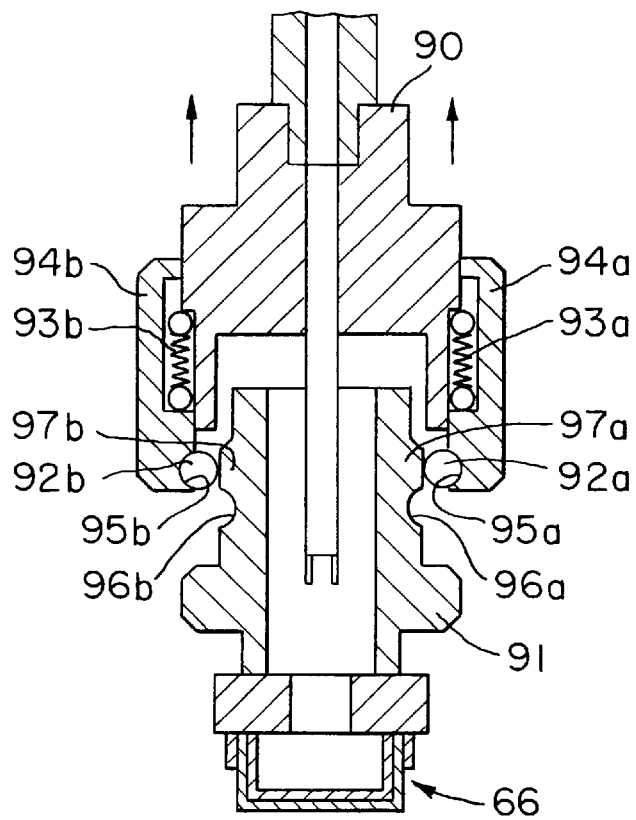
F I G. 14
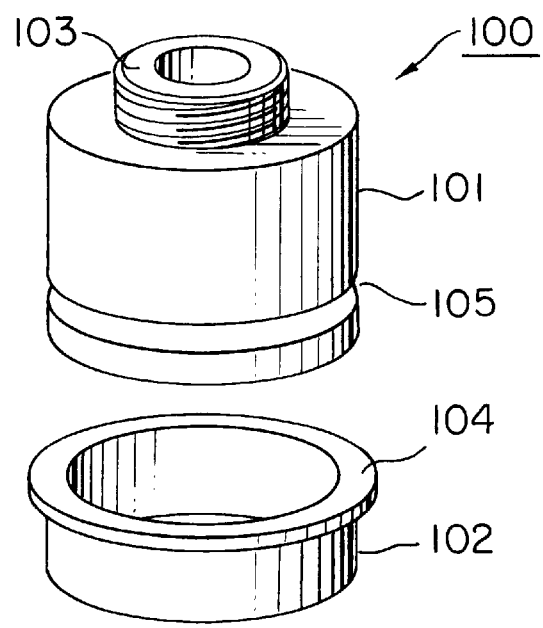
F I G. 15

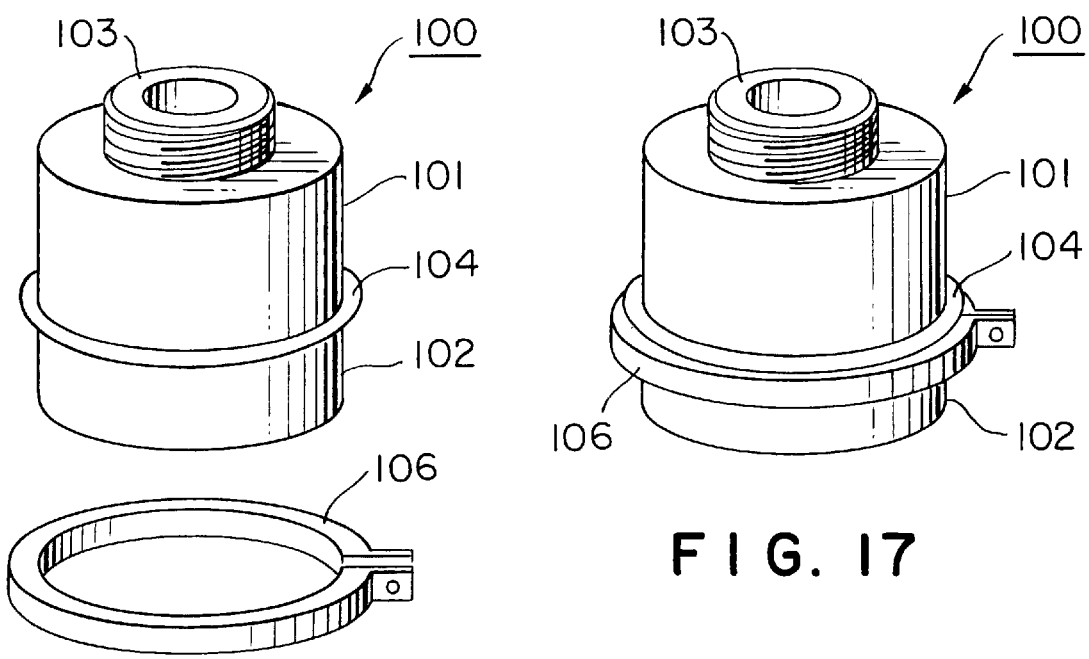
FIG. 16
FIG. 17
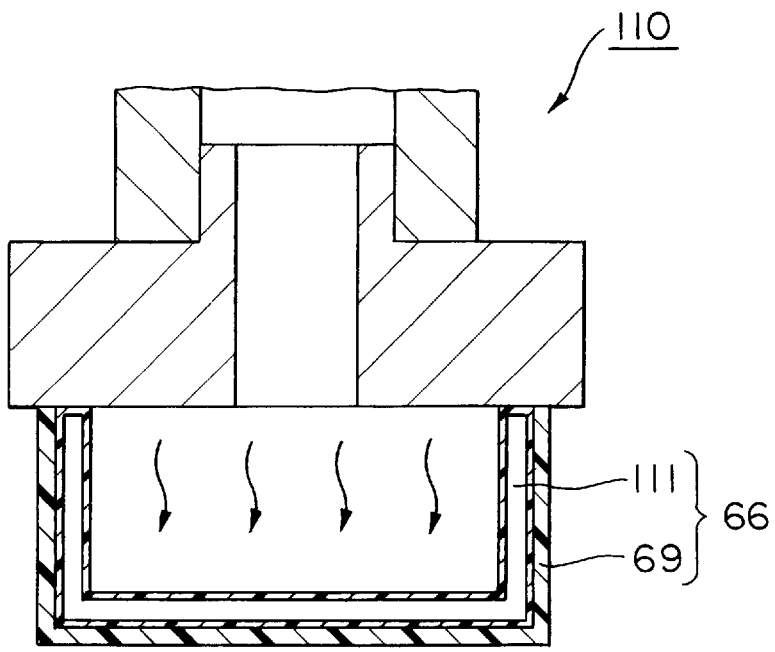
FIG. 18

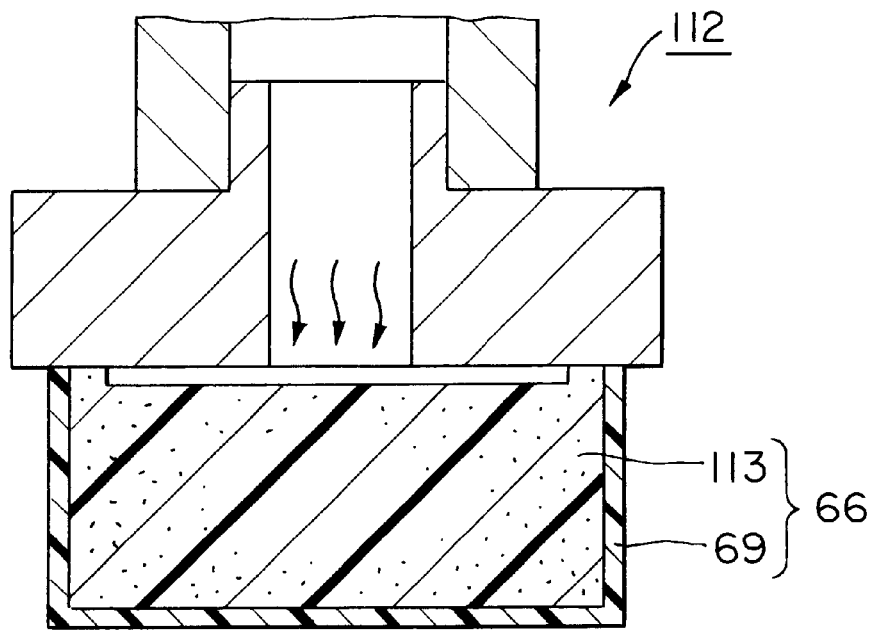
F I G. 19
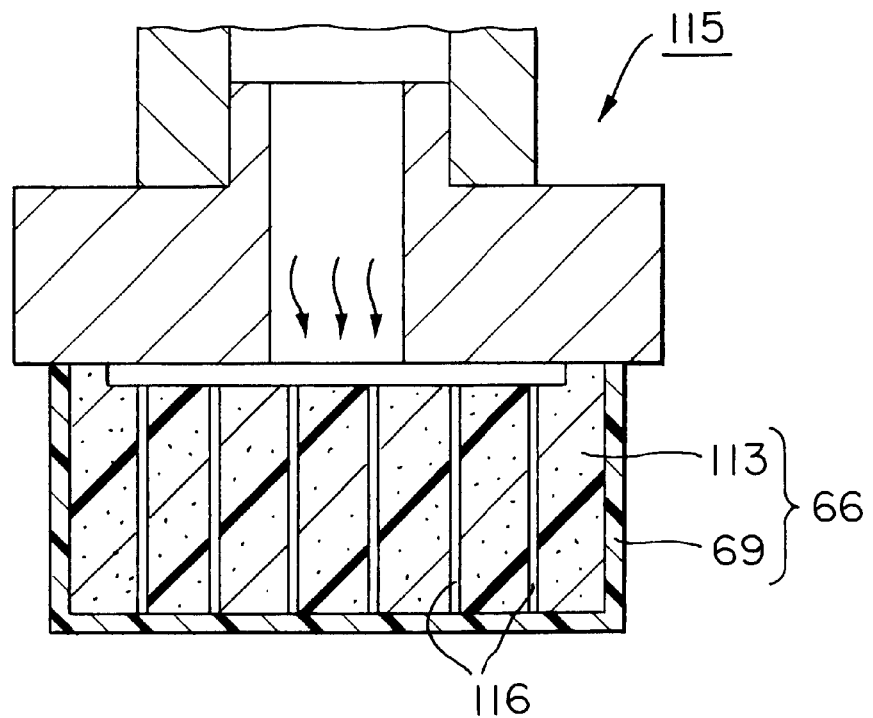
F I G. 20

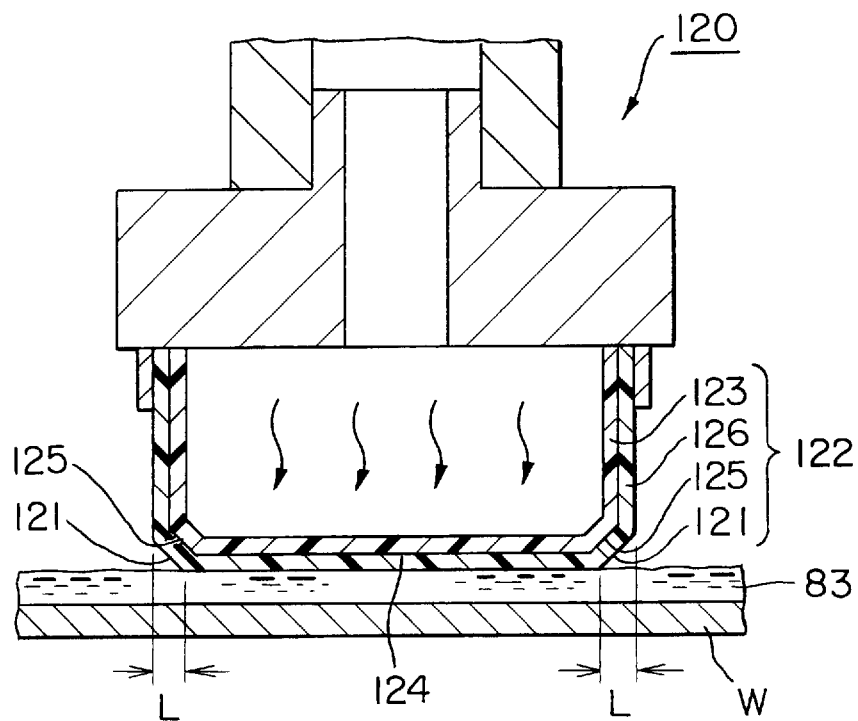
F I G. 21
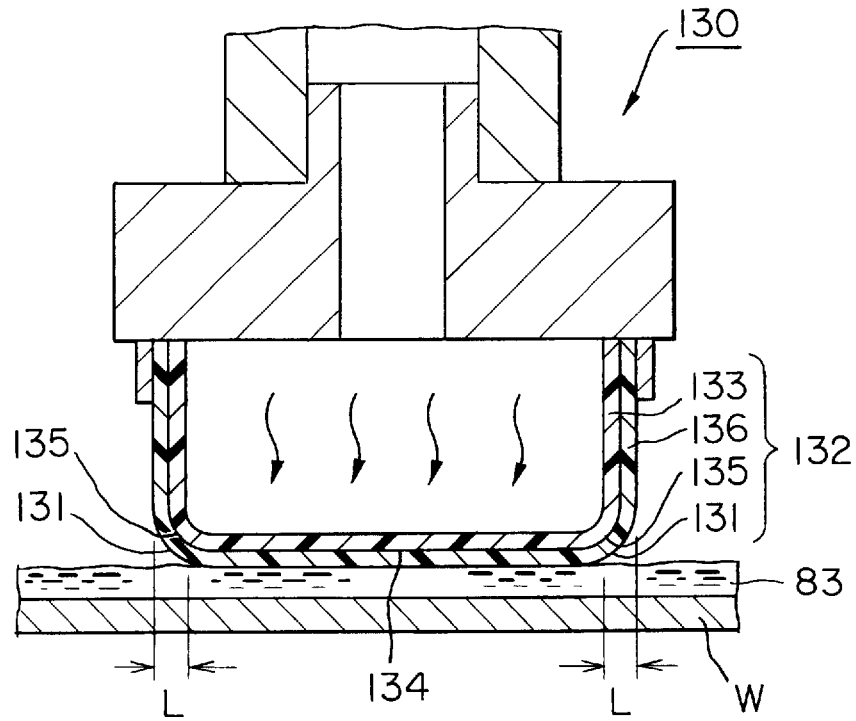
F I G. 22

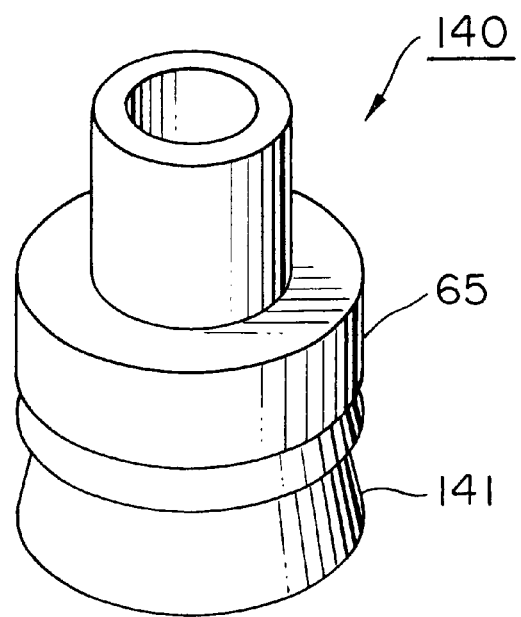
F I G. 23
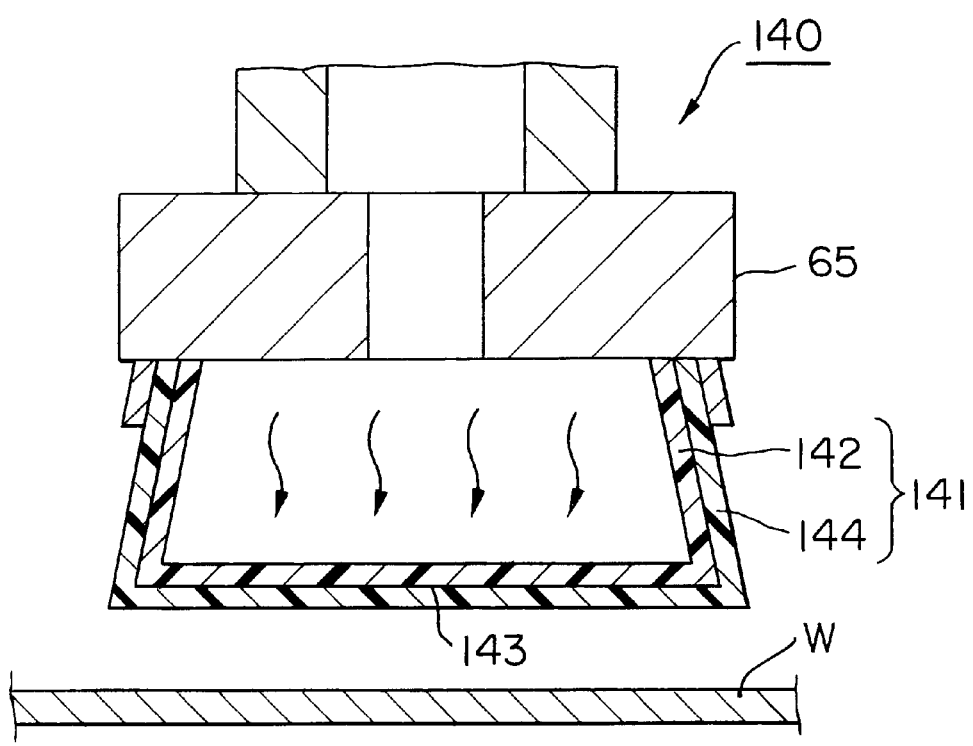
F I G. 24

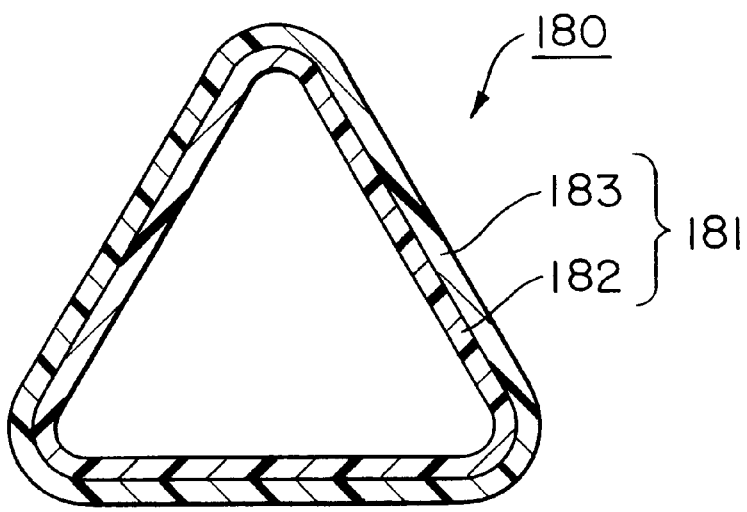
F I G. 31
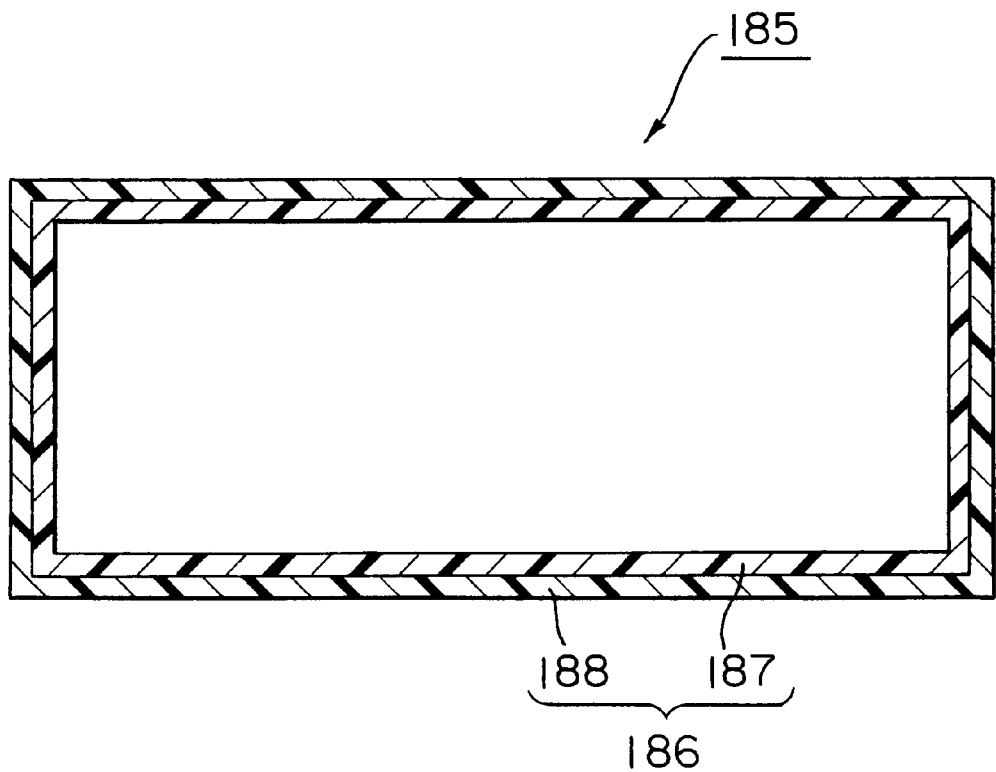
F I G. 32

SUBSTRATE CLEANING TOOL, HAVING PERMEABLE CLEANING HEAD

BACKGROUND OF THE INVENTION

1. Technical Field

The present invention relates to a substrate cleaning tool, apparatus, and method that are used in the cleaning of a substrate such as a semiconductor wafer.

2. Description of Related Art

During the fabrication of a semiconductor device, it is necessary to ensure a high level of cleanliness of the surfaces of the semiconductor wafer (hereinafter called "wafer") on which the semiconductor device is to be formed. For that reason, a substrate cleaning apparatus is used to clean the surfaces of the wafer at various stages, such as before and after each fabrication step or processing step, or after film-formation steps and polishing steps.

A substrate cleaning apparatus of this type has been disclosed in Japanese Patent No. 2875213, by way of example. This apparatus presses a head against the surface of the wafer, while the wafer is made to rotate, and removes particulate contaminants from the surface of the wafer by the relative motion between the wafer and the head.

In the substrate cleaning apparatus of this Japanese Patent No. 2875213, the head is configured of a protective film covering the surface of a cell-structure of foamed polyvinyl alcohol (PVA). Various other types of head are used in known substrate cleaning apparatuses, such as a stiff head formed of a material such as a head with hard and stiff nylon bristles or a flexible head formed of a material such as soft mohair, by way of example, and these heads have to be used differently as appropriate, depending on the type of cleaning.

With the substrate cleaning apparatus disclosed in Japanese Patent No. 2875213, particles of contaminants or the like readily adhere to the protective film, these particles are transferred to the wafer, and there is a fear that the particles will remain on the wafer after the cleaning. With a head such as a nylon head or mohair head, there is also the fear of damage to the surface of the wafer from friction or scratching, particularly with a stiff head, in addition to contamination of the wafer due to the transfer of particles. With such a prior-art head, the surface of the head becomes worn as the number of cleaning cycles increases, which leads to bias or "quirks," making it difficult to maintain the initial contact pressure and thus causing defective cleaning.

An object of the present invention is to provide a substrate cleaning tool that can maintain the initial contact pressure and clean a substrate in a satisfactory manner, with little adhesion of particles, no damage due to friction or scratching, and without creating bias or "quirks" due to wear of the surface thereof, together with a substrate cleaning apparatus and substrate cleaning method using that substrate cleaning tool.

SUMMARY OF THE INVENTION

In order to solve the above described problem, one aspect of the present invention relates to a cleaning tool for cleaning a substrate, the cleaning tool including: a cleaning head and a cleaning liquid supply path for supplying a cleaning liquid into the cleaning head; wherein the cleaning head comprises: a permeable core member and a permeable porous film covering an outer surface of the core member.

Cleaning is done with this cleaning tool by pressing the cleaning tool onto the surface of the substrate while a cleaning liquid is supplied through the cleaning liquid supply path, then causing the substrate and the cleaning tool to move relative to each other. The cleaning liquid supplied through the cleaning liquid supply path passes through the core member and the tiny holes formed in the porous film and is expelled onto the substrate, in a state in which the cleaning liquid is constantly expelled onto the surface of the substrate. There is therefore no need to worry about particles adhering to the surface of the substrate (in other words, to the surface of the porous film). This means that there is no need to worry about particles entering into the porous film, and there is no problem concerning contamination of the substrate by the transfer to the substrate of particles that have adhered to the porous film.

Moreover, since the porous film is placed into contact with the substrate in a state in which a liquid film is formed on the surface of the substrate by the expelled cleaning liquid, the contact between the porous film and the substrate can be done smoothly. In particular, if the porous film is placed indirectly into contact with the substrate, with the liquid film formed on the surface of the substrate therebetween, the contact between the porous film and the substrate can be done smoothly. This ensures that there is no damage to the substrate. In addition, since the porous film covers the core member, there is no need to worry about deformation of the porous film due to the supply pressure of the cleaning liquid, which makes it possible for the porous film to maintain its predetermined shape always. Since the contact between the porous film and the substrate is smoothed, there is no destruction of the shape thereof due to friction or other factors, even when the number of cleaning cycles increases.

The cleaning head may comprise a surface facing a substrate, that surface is formed to be a planar surface, and that planar surface is covered by the porous film. The cleaning head is preferably configured to comprise a cylindrical portion, wherein the planar surface is formed at an end portion of the cylindrical portion.

The permeable porous film is typically formed of a synthetic resin. The synthetic resin of the porous film may be either a hydrophilic resin or a hydrophobic resin.

The planar surface may have a groove through which a flow of the cleaning liquid is produced.

Another aspect of the present invention provides an apparatus for cleaning a substrate. This substrate cleaning apparatus comprises: a cleaning tool and a support mechanism for supporting the cleaning tool, a pressing mechanism for pressing the cleaning tool to the substrate; wherein the cleaning tool comprises a cleaning head and a cleaning liquid supply path for supplying a cleaning liquid into the cleaning head; and the cleaning head comprises: a permeable core member for receiving the supply of cleaning liquid from the cleaning liquid supply path and a permeable porous film covering an outer surface of the core member.

The pressing mechanism may be a pneumatic device. The cleaning liquid supply path may be provided with an ultrasonic wave generator for imparting ultrasonic wave oscillations to a cleaning liquid that passes therethrough.

A further aspect of this invention relates to method of cleaning a substrate, comprising the steps of: expelling a cleaning liquid from a cleaning tool formed of a permeable core member covered with a porous film, which is supplied with a cleaning liquid from a cleaning liquid supply path; and cleaning a surface of the substrate in a state in which a liquid film is formed between the surface of the substrate and the cleaning tool by the cleaning liquid expelled from the cleaning tool.

A still further aspect of this invention relates to a substrate cleaning method comprising the step of expelling a cleaning liquid through a cleaning tool that is formed of a permeable core member covered with a porous film, which is supplied with a cleaning liquid through a cleaning liquid supply path, and the step of cleaning a substate with the cleaning tool; wherein the cleaning method further comprises the steps of: recording a signal value into a control portion, for obtaining a predetermined contact pressure of the cleaning tool with respect to the substrate, before the substrate is cleaned by the cleaning tool; performing the cleaning while pressing the cleaning tool against the substrate; and controlling the pressing force of the cleaning tool so as to obtain the predetermined contact pressure.

BRIEF DESCRIPTION OF DRAWINGS

FIG. 14 is a vertical section taken through this other example of the attachment tool that is configured to be freely attached or removed with respect to the lower member, illustrating a state in which either the attachment tool is being removed from the lower member or the attachment tool is being attached to the lower member;

FIG. 15 is an explanatory view of a first step in the process of attaching a head portion to a main body;

FIG. 16 is an explanatory view of a second step in the process of attaching the head portion to the main body;

FIG. 17 is an explanatory view of a third step in the process of attaching the head portion to the main body;

FIG. 18 is a vertical section taken through a first modification of the cleaning tool;

FIG. 19 is a vertical section taken through a second modification of the cleaning tool;

FIG. 20 is a vertical section taken through a third modification of the cleaning tool;

FIG. 21 is a vertical section taken through a fourth modification of the cleaning tool;

FIG. 22 is a vertical section taken through a fifth modification of the cleaning tool;

FIG. 23 is a perspective view of a sixth modification of the cleaning tool;

FIG. 24 is a vertical section taken through the sixth modification of the cleaning tool;

FIG. 31 is a lateral section taken through an eleventh modification of the cleaning tool;

FIG. 32 is a lateral section taken through a twelfth modification of the cleaning tool;

DESCRIPTION OF THE PREFERRED EMBODIMENTS

Figure 1:
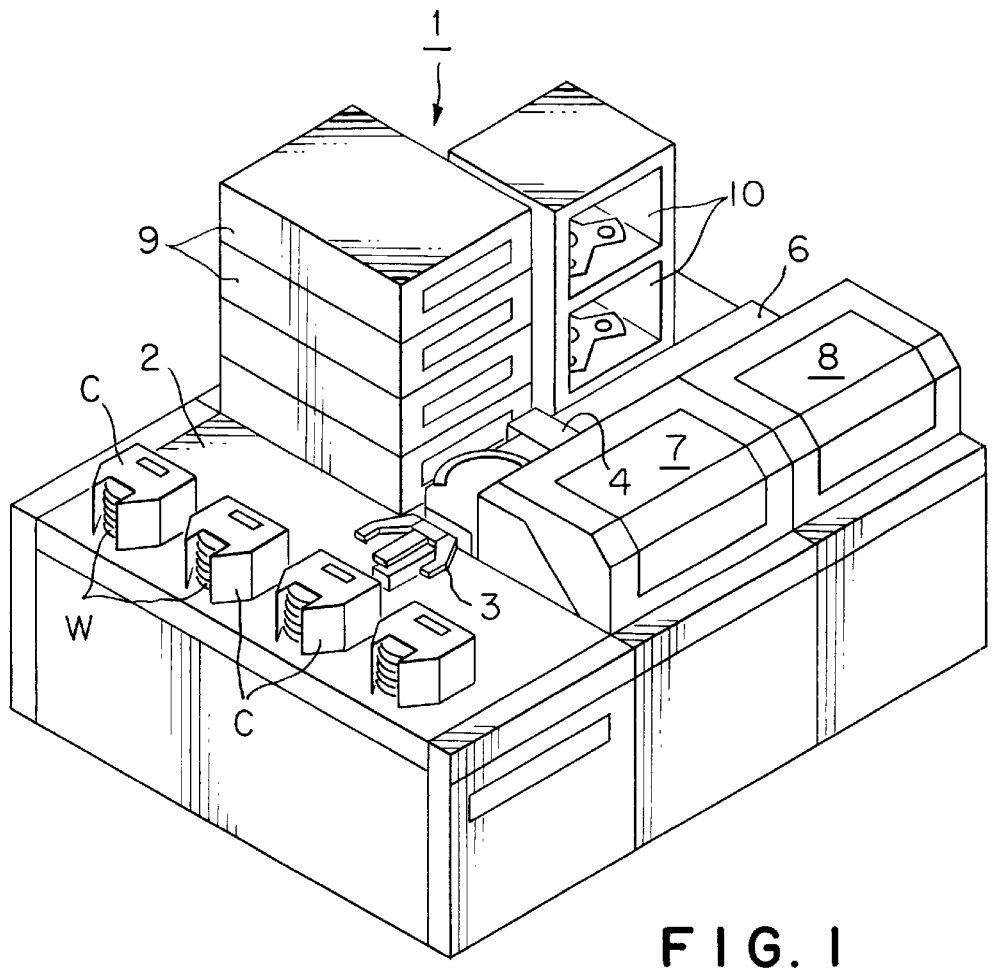
FIG. 1 is a perspective view of a cleaning apparatus provided with a substrate cleaning apparatus in accordance with an embodiment of the present invention.

Preferred embodiments of the present invention will be described below as relating to a cleaning apparatus that cleans the front and rear surfaces of a semiconductor wafer, which is an example of a substrate. A perspective view of a cleaning apparatus 1 that incorporates a substrate surface cleaning unit 7 in accordance with this invention is shown in FIG. 1. The cleaning apparatus 1 is configured in such a manner that a carrier C containing wafers W conveys the wafers W thereinto, in conveyor units; the wafers W are removed from the carrier C one-by-one that are cleaned and dried; the cleaned and dried wafers W are returned into the carrier C; and the carrier is conveyed out as a single unit.

The cleaning apparatus 1 is provided with a mounting section 2 that enables the mounting of a number of carriers C containing the wafers W, such as four carriers C. At the center of the cleaning apparatus 1 is disposed an extraction/storage arm 3 for removing the uncleaned wafers W one at a time from the carriers C mounted on the mounting section 2, then accommodating each cleaned wafer W into one of the carriers C. A conveyor arm 4 that is a conveyor mechanism for delivering and receiving the wafers W to and from the extraction/storage arm 3 is held on a back portion of this extraction/storage arm 3. The conveyor arm 4 is provided so as to be capable of moving along a conveyor path 6 provided in the center of the cleaning apparatus 1.

Various processing apparatuses are disposed on both sides of the conveyor path 6. More specifically, the previously mentioned substrate cleaning unit 7 for cleaning the upper surfaces of the wafers W and a substrate cleaning unit 8 for cleaning the lower surfaces of the wafers W are disposed in line on one side of the conveyor path 6. These units 7 and 8 are configured to rotate the wafers W and thus spin them to dry the same. Four heating devices 9 are provided in a stack on the other side of the conveyor path 6. These heating devices 9 are means for heating the wafers W to dry them. Two wafer inversion devices 10 are provided in a stack in the vicinity of the heating devices 9.

Figure 2:
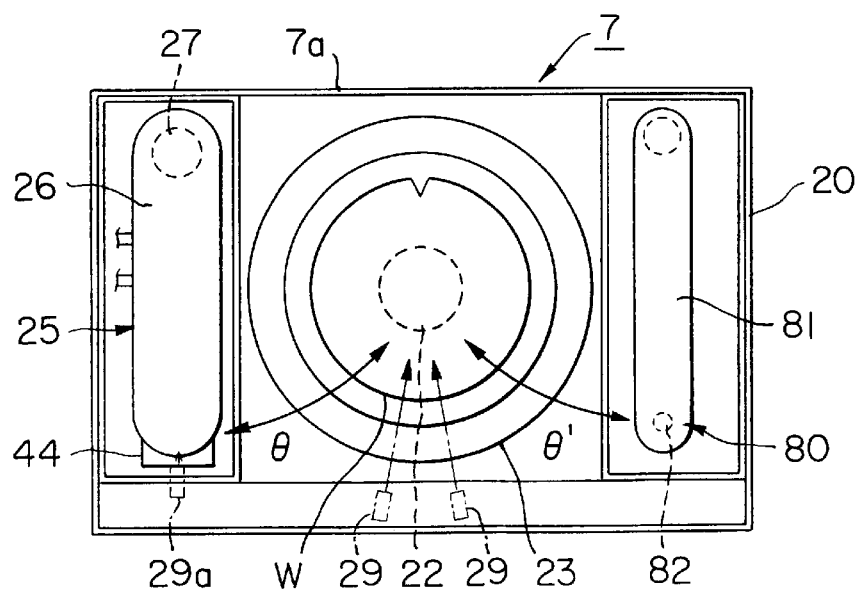
FIG. 2 is a plan view of the substrate cleaning apparatus of this embodiment of the invention.
Figure 3:
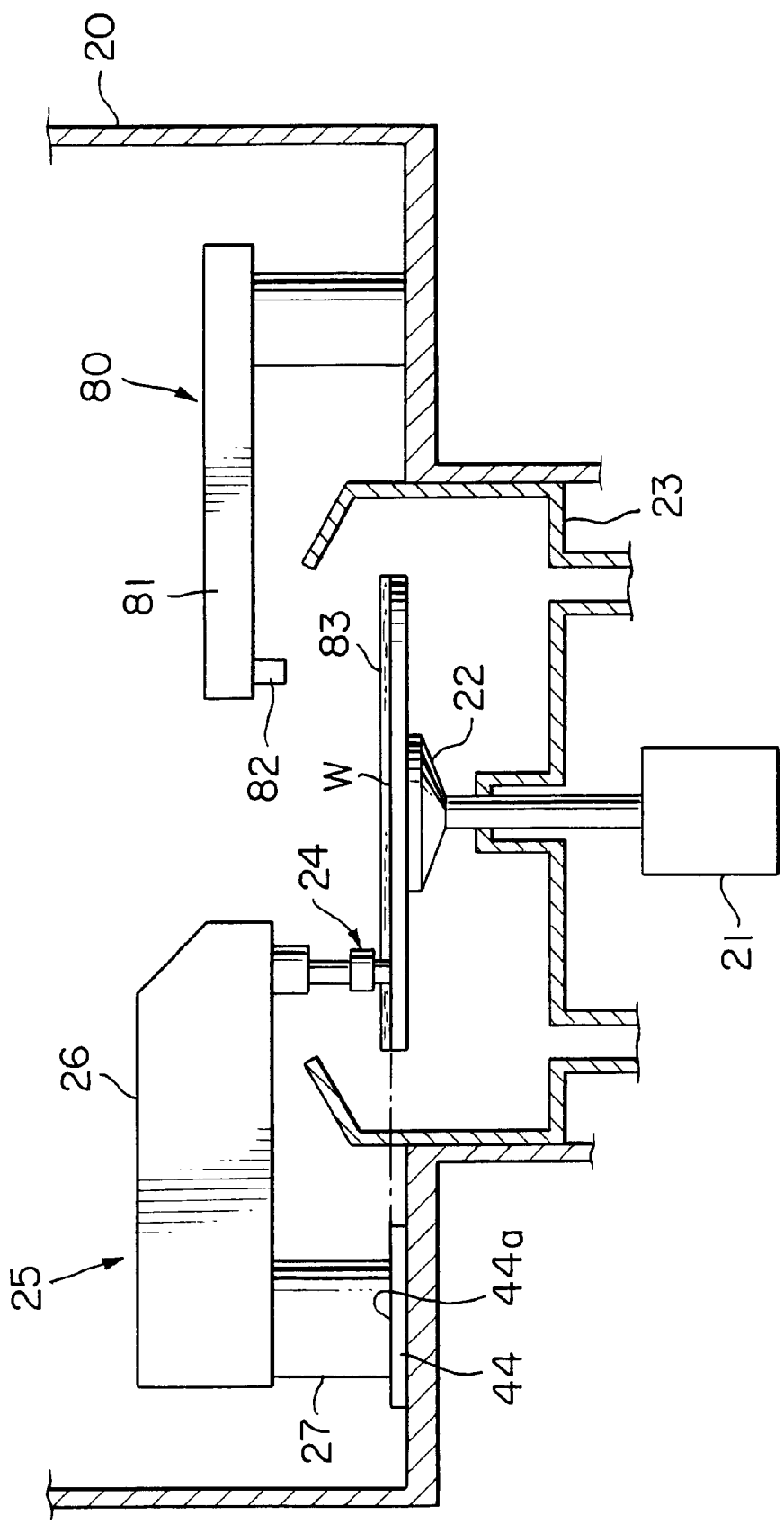
FIG. 3 is a vertical section taken through the substrate cleaning apparatus of this embodiment of the invention.

The description now turns to the configuration of the substrate cleaning unit 7. A plan view of this substrate cleaning unit 7 is shown in FIG. 2 and a vertical section therethrough is shown in FIG. 3. At substantially the center of a case 20 are provided a spin chuck 22 for rotating a wafer W that is sucked hereto in a horizontal state, a motor 21 for causing the spin chuck 22 to rotate, and a cap 23 for surrounding the spin chuck 22 and the wafer W. The cap 23 prevents any cleaning liquid such as distilled water supplied to the upper surface of the wafer W from flying off into the surroundings. A scrub cleaner device 25 is disposed in the vicinity of the case 20. This scrub cleaner device 25 acts to cause a cleaning tool 24 acting as a substrate cleaning to contact the surface of the wafer W for cleaning operation.

In FIG. 2, the scrub cleaner device 25 is shown in a state in which it is in standby at a position distanced from the wafer W. A conveyor exit 7a that can be freely opened and closed by a shutter (not shown in the figure) is provided on a front surface side of the case 20, and the configuration is such that each wafer W is conveyed into and out of the substrate cleaning unit 7 by the conveyor arm 4 through the conveyor exit 7a. Note that any other means of holding the wafer W can be used, other than an suction type of spin chuck 22, such as a mechanical chuck that uses claws or a ring to hold the peripheral edge of the wafer W.

The cleaning tool 24 of the scrub cleaner device 25 is attached to a free end portion of a horizontal arm 26, and a base end portion of the horizontal arm 26 is fixed to an upper end of a vertical shaft 27. The configuration of the shaft 27 is such that it can be freely elevated and rotated by a drive mechanism (not shown in the figures). Thus the arm 26 can be swiveled in the θ direction shown in FIG. 2 by the rotational drive of the drive mechanism so that the cleaning tool 24 can swing in a reciprocal motion in an arc above the wafer W.

Figure 4:
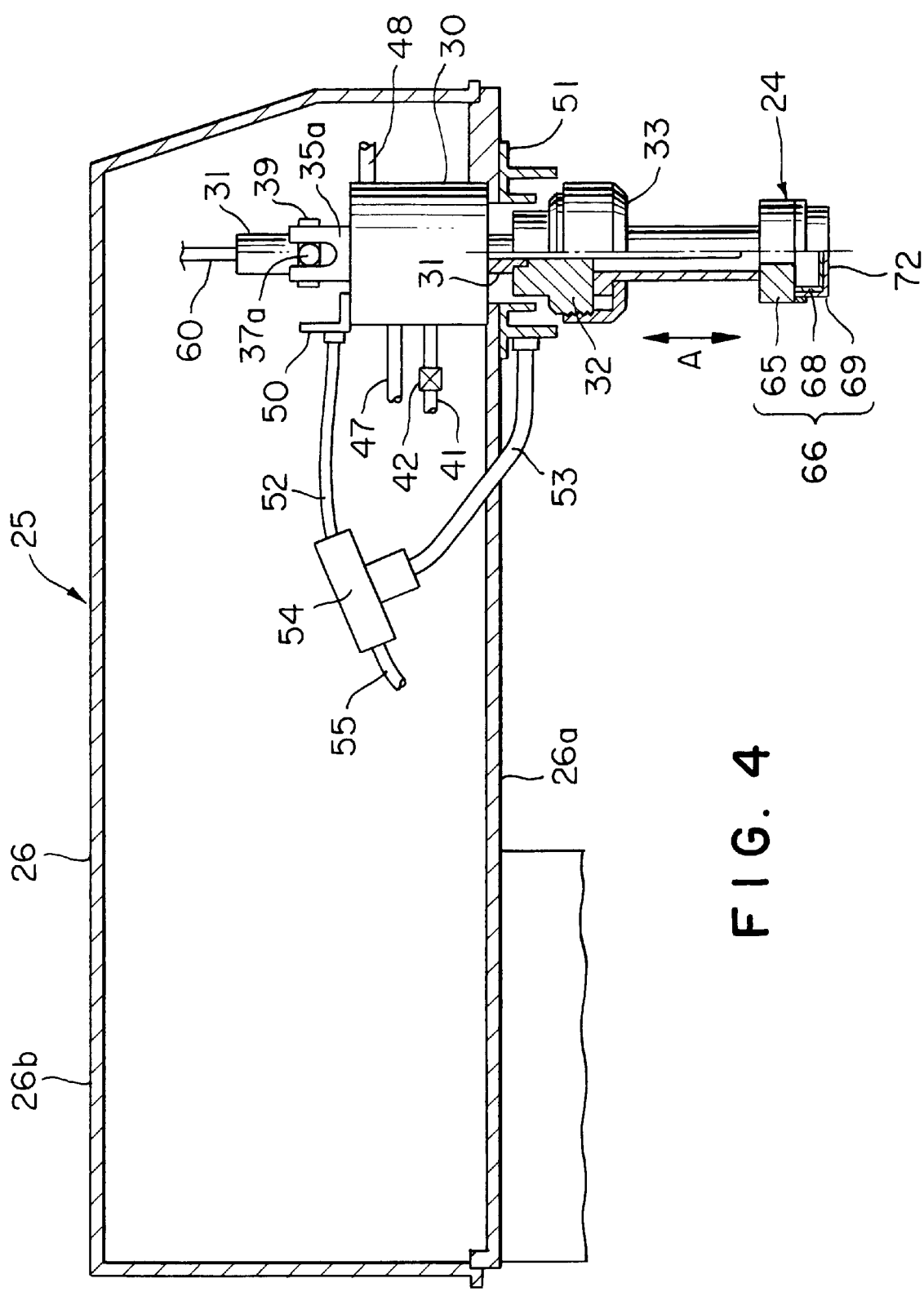
FIG. 4 is a vertical section taken through the arm.

As shown in FIG. 4, the arm 26 comprises a bottom frame 26a and a cover 26b that covers the same. An air bearing cylinder 30 that raises and lowers the cleaning tool 24 is provided at a free end portion of the arm 26, fixed on top of the bottom frame 26a. In this case, there is no provision of complicated transmission components formed of a driven pulley and belt for transmitting the driving power of a motor and motor rotational mechanism to the cleaning tool 24, which ought to be provided at a base end portion and a central portion of the arm 26 for rotating the cleaning tool 24 if this were a prior-art apparatus. For that reason, it is sufficient that the scrub cleaner device 25 does not cause the cleaning tool 24 to rotate when it is in contact with the wafer W.

A rod 31 that acts as a pressure shaft within the air bearing cylinder 30 protrudes from each of the upper end and the lower end of the air bearing cylinder 30. A lower end portion of the rod 31 is attached by a lower member 32 and an attachment tool 33 to an upper end portion of a shank that extends upward from the cleaning tool 24. The configuration is such that the assembly of the rod 31 and the cleaning tool 24 is raised and lowered in the vertical direction (in the directions of the double arrow A in FIG. 4) as the air bearing cylinder 30 operates. A female thread provided on the inner wall of the attachment tool 33 engages with a male thread provided on the outer periphery of the lower member 32, so that the attachment tool 33 can be freely attached or removed. This facilitates replacement with a new cleaning tool 24 when the old cleaning tool 24 has reached the end of the lifetime thereof. It also makes it possible to combine various different cleaning operations and attach various different cleaning tools to the scrub cleaner device 25 in a simple manner.

Figure 5:
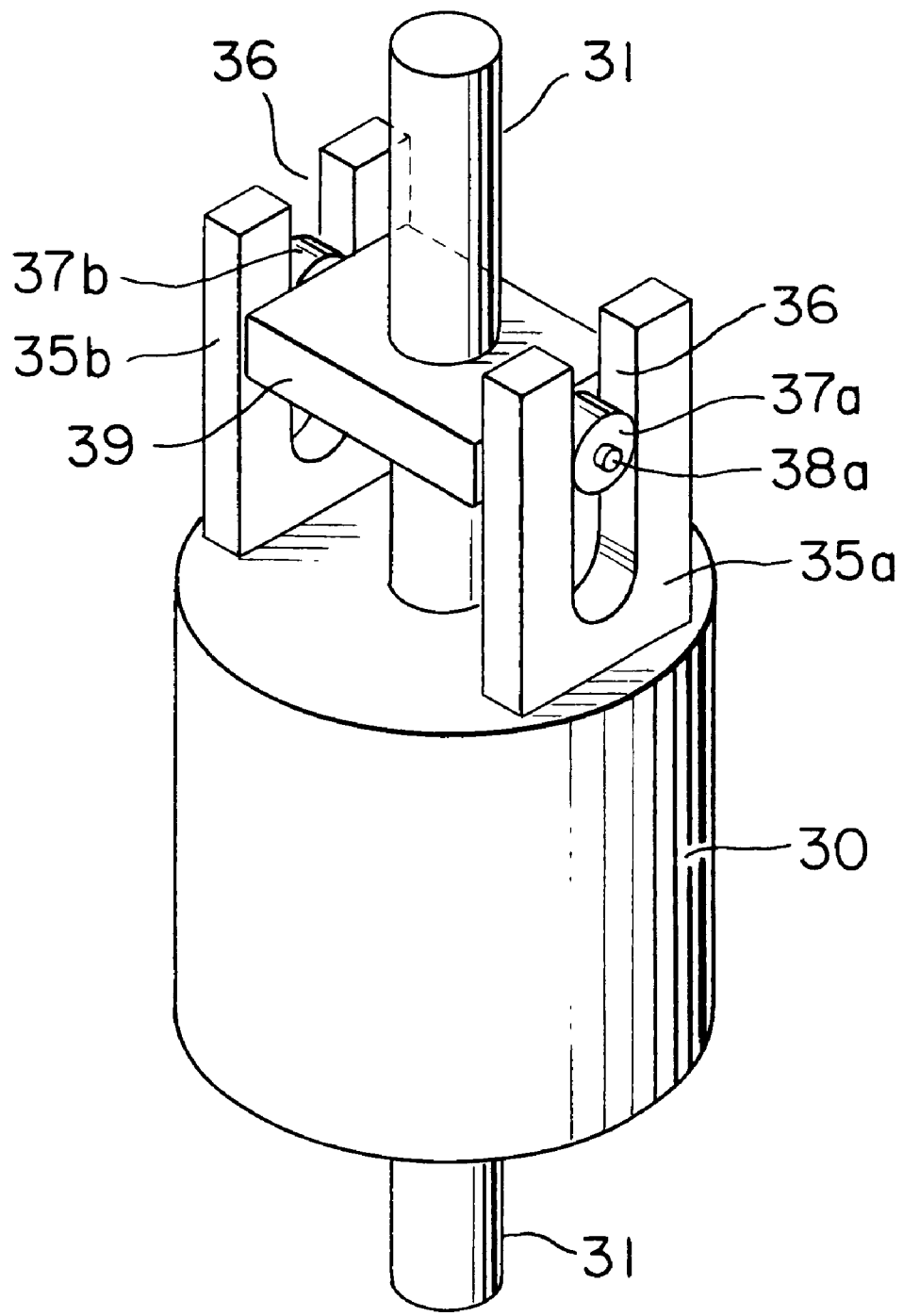
FIG. 5 is a perspective view of an air bearing cylinder.

As shown in FIG. 5, guide members 35a and 35b are disposed on two sides of the upper surface of the air bearing cylinder 30. Each of these guide members 35a and 35b is formed in a U-shape to define an aperture 36. A roller 37a is disposed in the aperture 36 of the guide member 35a and another roller 37b is disposed in the aperture 36 of the other guide member 35b. A rectangular plate 39 is attached in a freely rotatable manner to the roller 37a by a horizontal bearing 38a and to the roller 37b by another horizontal bearing (not shown in the figure). The rod 31 both passes through the rectangular plate 39 in the vertical direction and is affixed thereto. Thus the vertical movement of the rod 31 is smoothed as the rollers 37a and 37b are guided within the apertures 36.

Figure 6:
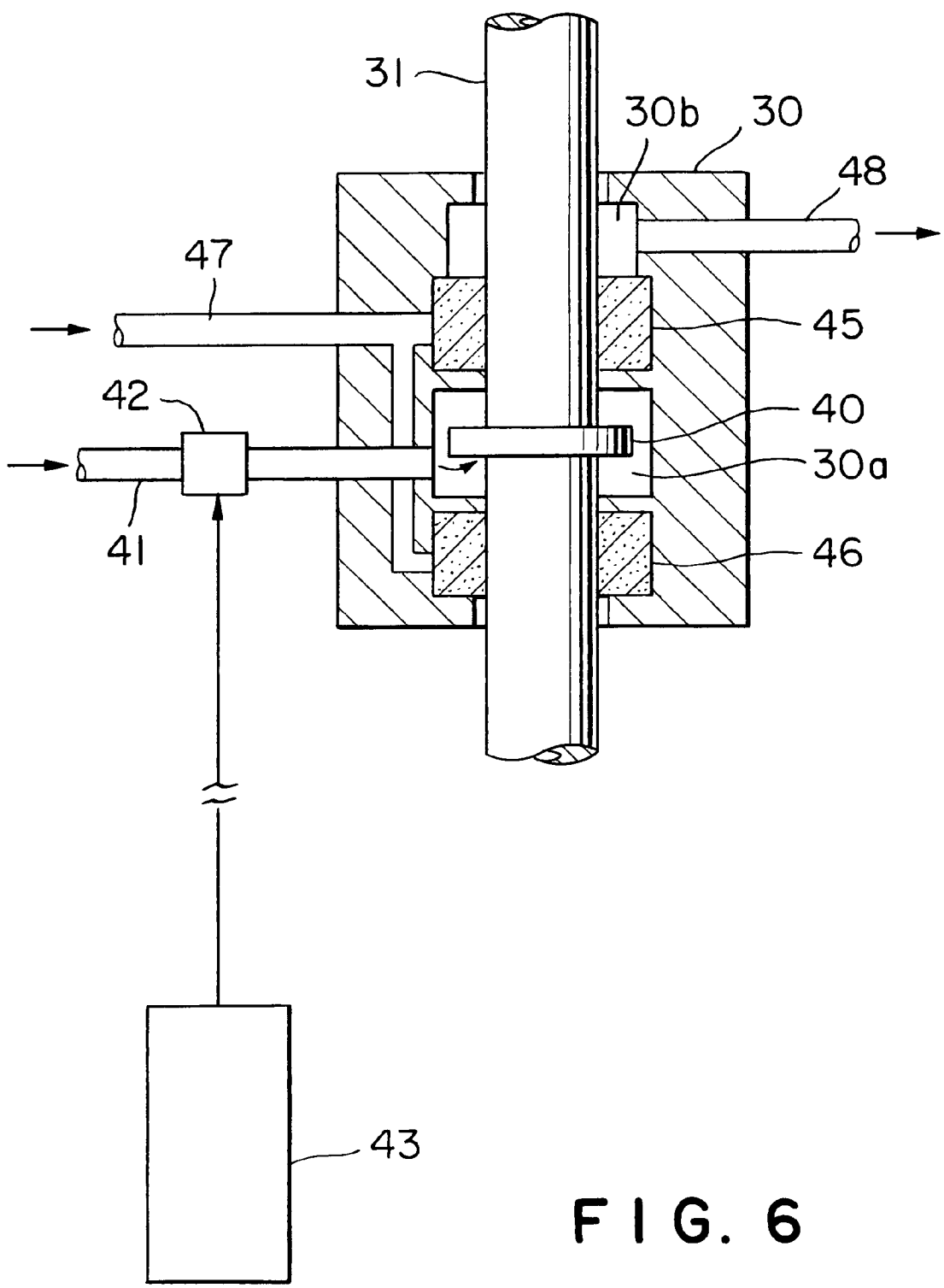
FIG. 6 is a vertical section taken through the air bearing cylinder.

As FIG. 6 shows, within the air bearing cylinder 30 are formed a supply chamber 30a for supplying a gas such as air and a supply/exhaust chamber 30b for both supplying and exhausting the gas. The supply/exhaust chamber 30b is positioned higher than the supply chamber 30a, and the supply chamber 30a and supply/exhaust chamber 30b are mutually connected. The rod 31 passes through the supply chamber 30a and the supply/exhaust chamber 30b, and a ring-shaped stopper 40 is attached to the rod 31. This stopper 40 is disposed within the supply chamber 30a and prevents the rod 31 from becoming detached from the air bearing cylinder 30. Note that the stopper 40 could equally well be attached to the rod 31 in such a manner that it can be disposed in the supply/exhaust chamber 30b.

A gas supply path 41 for supplying a gas such as air is connected to the supply chamber 30a of the air bearing cylinder 30 and a electropneumatic regulator 42 for adjusting the supply pressure of the gas is provided at an intermediate portion of the gas supply path 41. A control unit 43 is connected to the electropneumatic regulator 42, with the configuration being such that the control unit 43 outputs a predetermined electrical signal to the electropneumatic regulator 42 to adjust the supply pressure of gas flowing within the air bearing cylinder 30. The configuration is therefore such that the vertical driving force of the rod 31 is controlled freely by the supply pressure of gas that is supplied from the gas supply path 41.

During the scrubbing, the stopper 40 shown in FIG. 6 is held in a floating state by the supply pressure of gas from this gas supply path 41. The configuration is such that a vertical driving force is applied to the rod 31 to a degree such that the cleaning tool 24 does not separate from the neighborhood of the surface of the wafer W, and a predetermined contact pressure such as 60 gf or less is created by either the sum of the self-weight of the cleaning tool 24 and the driving force imparted to the cleaning tool 24 by the rod 31, or the difference therebetween. If an upward driving force of 80 gf is applied to a cleaning tool that weighs 100 gf, the contact pressure of the cleaning tool with respect to the wafer will be 20 gf; if a downward driving force of 10 gf is applied to a cleaning tool that weighs 50 gf, the contact pressure of the cleaning tool with respect to the wafer will be 60 gf. Thus the air bearing cylinder 30 is configured in such a manner that it applies a vertical driving force on the rod 31 that presses the cleaning tool 24.

Figure 7:
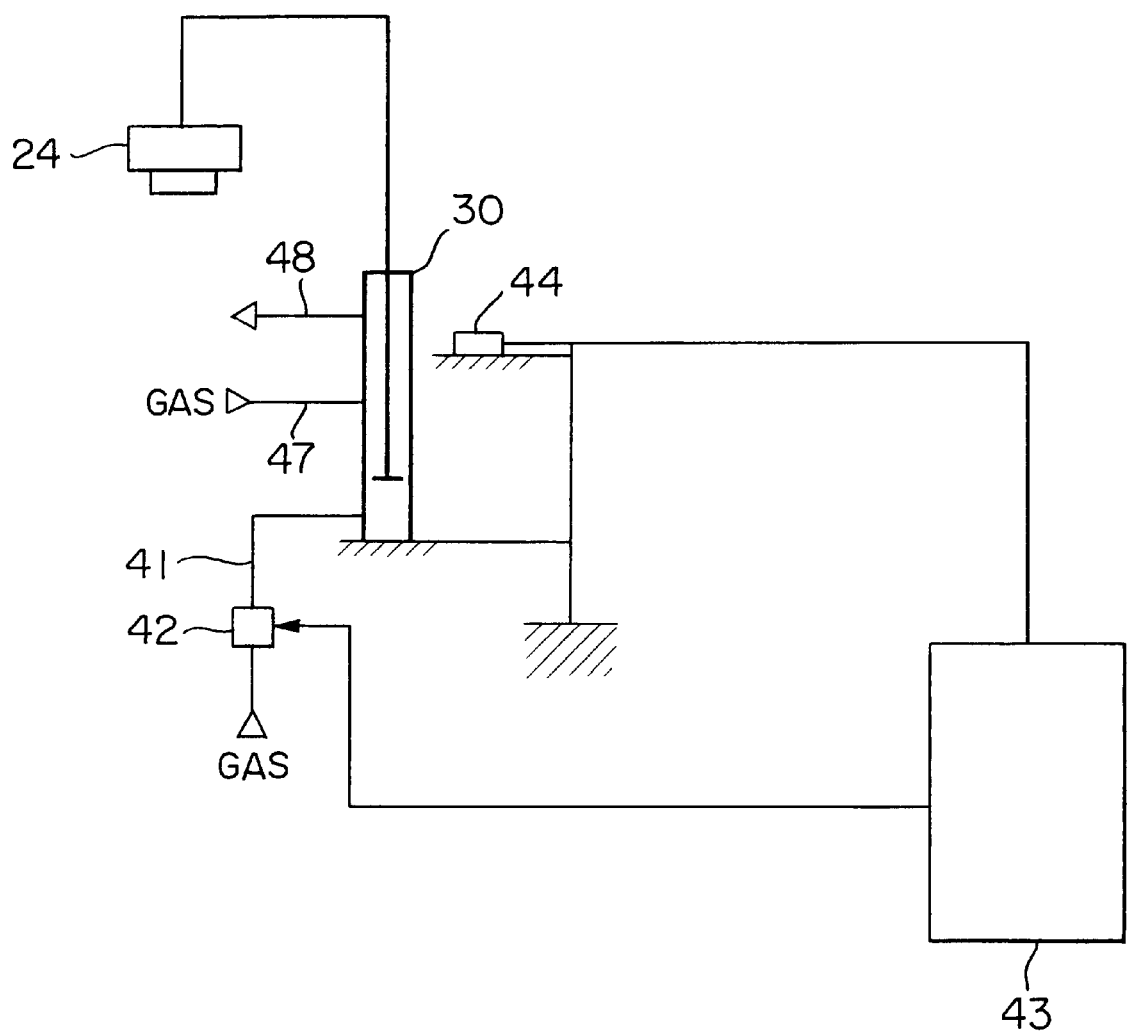
FIG. 7 is a circuit diagram illustrating the relationship between an electropneumatic regulator and a control unit.

A circuit diagram illustrating the relationship between the electropneumatic regulator 42 and the control unit 43 is shown in FIG. 7. The arrangement by which the controller 43 outputs an electrical signal to the electropneumatic regulator 42 will be described. First of all, a measurement sensor 44 for measuring the contact pressure of the cleaning tool 24 is provided at a position separated from the wafer W, as shown in FIGS. 2 and 3. This measurement sensor 44 consists of a load cell or the like which detects strain generated by a load as a fluctuation in an electrical resistance. When the scrub cleaner device 25 is on standby during processes other than cleaning, the cleaning tool 24 is placed in contact with the measurement sensor 44 and the contact pressure thereof is measured. Based on the result of this measurement, data of an electrical signal for determining that the contact pressure of the cleaning tool 24 has exceeded a predetermined value is stored in the control unit 43. The configuration is such that, when it comes to the stage of actual cleaning, the control unit 43 sends a predetermined electrical signal to the electropneumatic regulator 42 on the basis of this stored data, the supply pressure of the gas supplied to the air bearing cylinder 30 is adjusted, whereby the driving force of the rod 31 and the contact pressure of the cleaning tool 24 are controlled. Thus the contact pressure of the cleaning tool 24 can be freely controlled.

In order to measure the contact pressure of the cleaning tool 24 accurately during the cleaning in this case, it is preferable to ensure that the height of a measurement surface 44a of the measurement sensor 44 is equal to the height of the upper surface of the wafer W which is held on the spin chuck 22, as shown in FIG. 3. The contact pressure of the cleaning tool 24 can be adjusted by the controller 43 controlling the electropneumatic regulator 42 to give values of 10 gf, 20 gf, 30 gf, 40 gf, and 50 gf.

Figure 11:
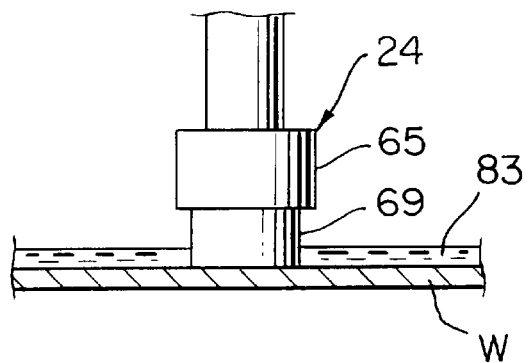
FIG. 11 illustrates a state when the cleaning tool is placed in direct contact with the surface of the wafer, with a film of distilled water therearound.

The "contact pressure" mentioned above means a pressing force exerted when the cleaning tool 24 directly contacts the surface of the wafer W as will be described hereinafter with reference to FIG. 11, as well as a pressing force of the cleaning tool 24 when the surface of the cleaning tool 24 is pressed to the surface of the wafer W through a film 83 of the cleaning liquid interposed therebetween, as will be described hereinafter with reference to FIG. 12. In the case when the surface of the cleaning tool 24 is pressed to the wafer W through the cleaning liquid film 83, the measurement of the "contact pressure", which is carried out by pressing the cleaning tool 24 to the measurement sensor 44 is performed while expelling the cleaning liquid from the cleaning tool 24 to the surface of the measurement sensor 44 and while ejecting the cleaning liquid from a nozzle 29a onto the surface of the measurement sensor 44 as shown in FIG. 2.

The interior of the air bearing cylinder 30 is also provided with ring-shaped air bearings 45 and 46 made of a porous ceramic at two positions at top and bottom, as shown in FIG. 6, and a gas supply path 47 for the air bearings, which supplies air to these air bearings 45 and 46, is connected to the air bearing cylinder 30. The gas supply path 47 branches midway so as to enable a supply of gas to both the supply chamber 30a and the supply/exhaust chamber 30b. The air bearings 45 and 46 that have been supplied gas from the gas supply path 47 to the air bearings create a frictionless state wherein the rod 31 is floating in mid-air. The configuration is such that operation is supported to ensure that the raising and lowering of the rod 31 is done stably. The sliding resistance to the raising and lowering of the rod 31 is therefore equal to zero, giving the sliding components excellent abrasion resistance. Note that an exhaust path 48 is connected to the supply/exhaust chamber 30b in such a manner that gas does not accumulate therein.

Gas may be supplied to the gas supply paths 41 and 47 from separate gas sources, as shown in FIG. 6, or gas may be supplied to each of the gas supply paths 41 and 47 from a common gas source. Note that the configuration is such that gas is supplied constantly to the supply chamber 30a and the supply/exhaust chamber 30b from the gas supply path 47. In contrast thereto, gas is supplied from the gas supply path 41 to the supply chamber 30a only when the cleaning tool 24 is pressured.

A bracket 50 is attached to the upper surface of the air bearing cylinder 30, as shown in FIG. 4. A protective cover 51 is provided on a lower surface at the far end of the arm 26, with an upper end thereof fixed to a lower surface of the frame 26a, surrounding the lower peripheral portions of the rod 31 and the lower member 32. An exhaust tube 52 is connected to the bracket 50 and a similar exhaust tube 53 is connected to the protective cover 51. These exhaust tubes 52 and 53 join at a confluence portion 54 that is connected to a vacuum apparatus (not shown in the figure). Thus the configuration is such that, even if particles should be created by the vertical motion of the rod 31, those particles are exhausted to the outside of the arm 26 by the exhaust tubes 52 and 53 together with the exhaust gases. It is therefore not possible for particles to drop onto the surface of the wafer W.

Figure 8:
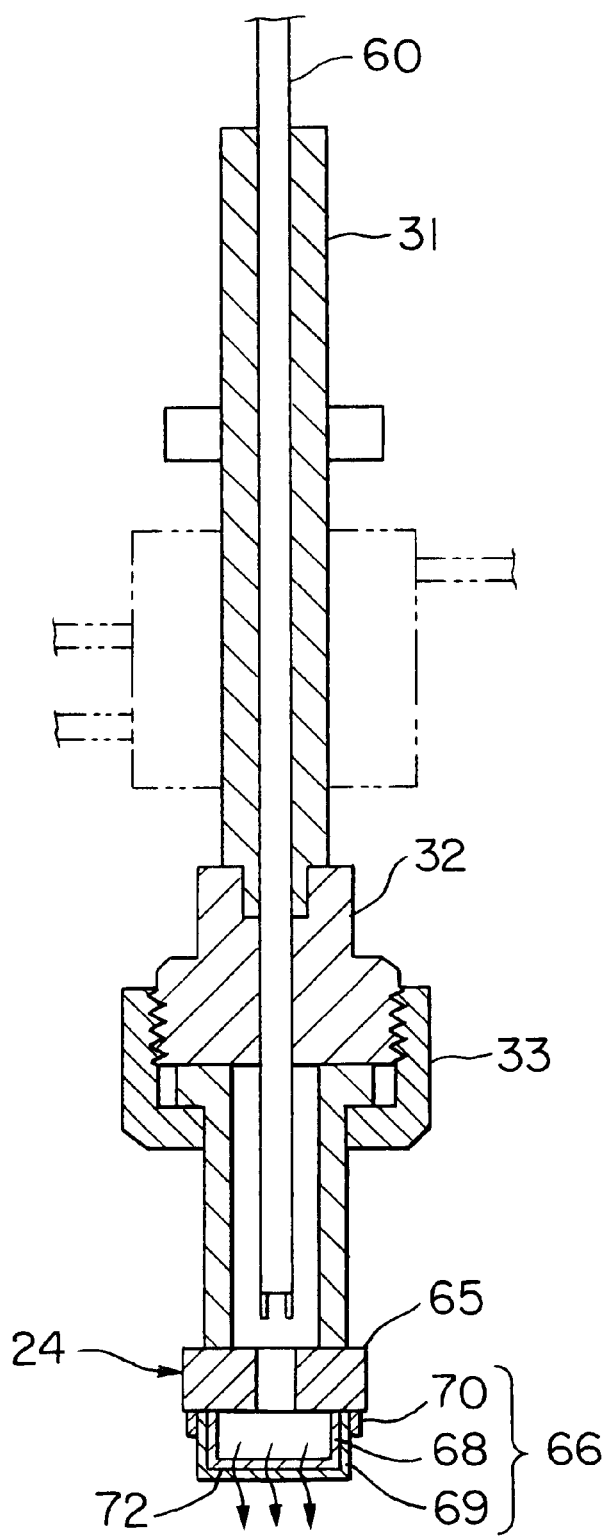
FIG. 8 is a vertical section taken through a rod, lower member, attachment tool, and cleaning tool.

A section taken through the rod 31, the lower member 32, the attachment tool 33, and the cleaning tool 24 is shown in FIG. 8. As shown in this figure, a distilled water supply path 60 for supplying distilled water, for example, as a cleaning liquid to the wafer W is configured to pass through the interiors of the rod 31, the lower member 32, and the attachment tool 33. Thus, the supply path 60 supplies distilled water to the interior of the cleaning tool 24. In this case, there is no rotation of the cleaning tool 24, as previously mentioned, so it is sufficient that the rod 31, the lower member 32, and the attachment tool 33 are moved vertically, making it possible to provide the distilled water supply path 60 within the rod 31, the lower member 32, and the attachment tool 33 without requiring a complicated sealing mechanism or the like.

Figure 9:
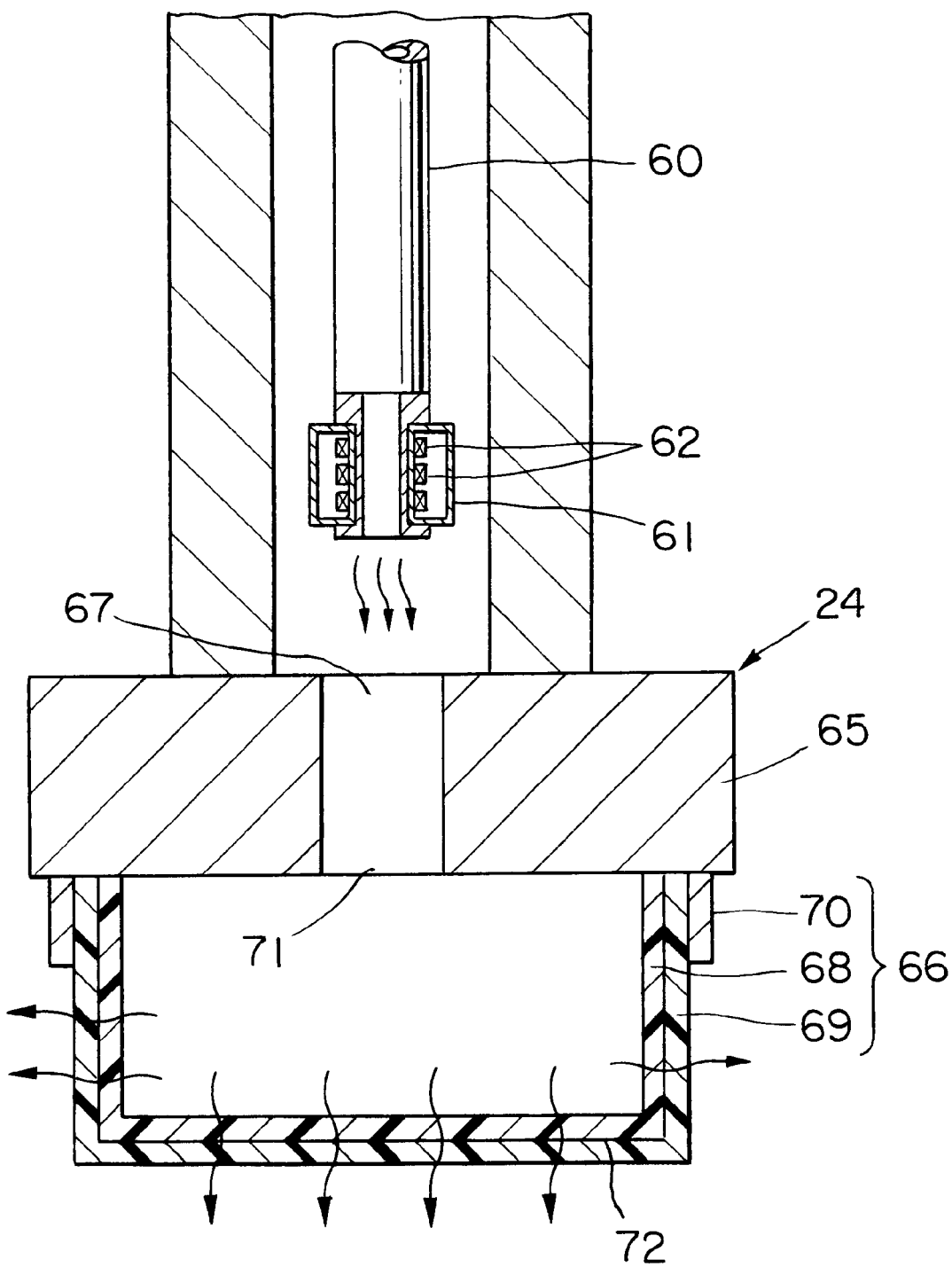
FIG. 9 is an enlarged section through part of the attachment tool and the cleaning tool.

As shown in FIG. 9, an ultrasonic wave generation apparatus 61 is provided at a far end portion of the distilled water supply path 60. and a plurality of ring-shaped ultrasonic wave generation elements 62 is provided within the ultrasonic wave generation apparatus 61 so as to surround the distilled water supply path 60. The ultrasonic wave generation apparatus 61 may be configured in such a manner that it can be turned on and off by a power control unit (not shown in the figure), and it can also be configured in such a manner that the strength of the ultrasonic waves generated by the ultrasonic wave generation apparatus 61 can be adjusted. The ultrasonic wave generation apparatus 61 could equally well be provided on the exterior of the cleaning tool 24.

Figure 10:
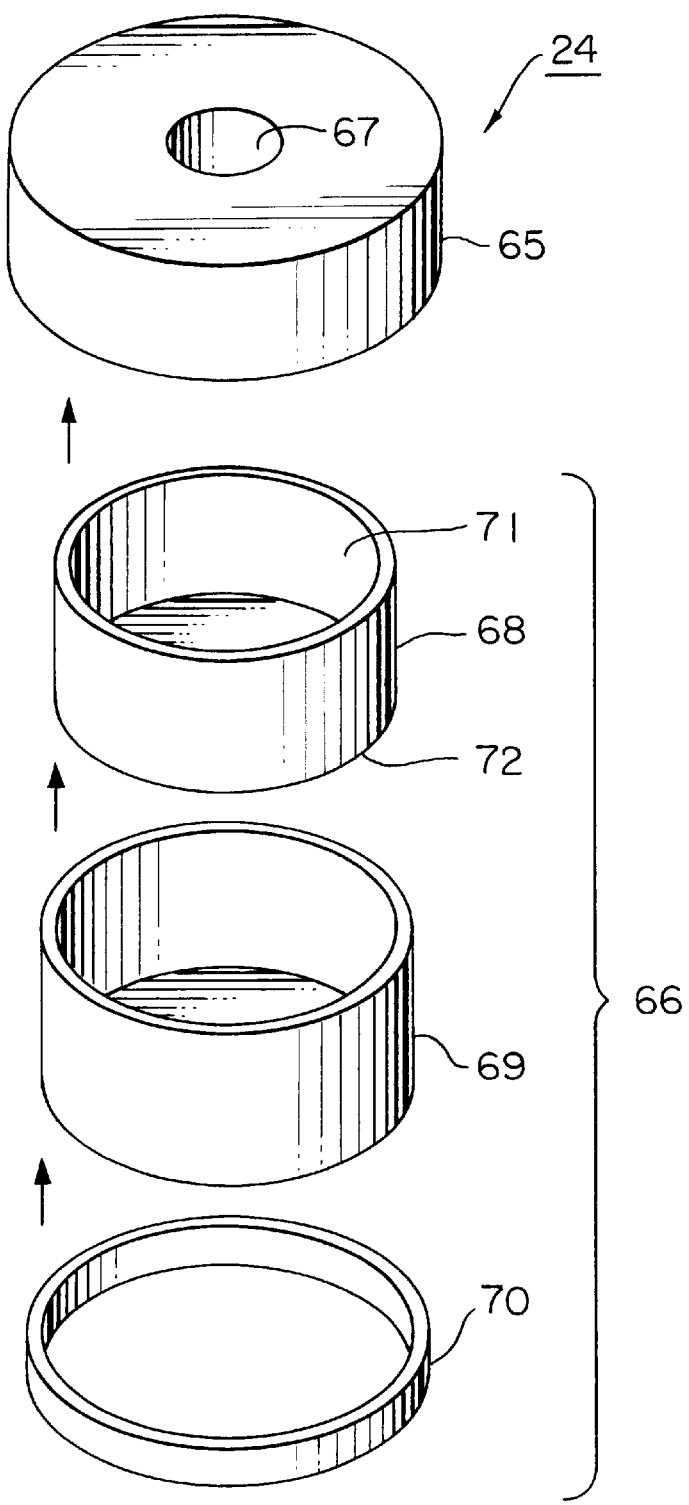
FIG. 10 is a perspective view of structural components of the cleaning tool, shown exploded.

As shown in FIGS. 9 and 10, the cleaning tool 24 comprises a circular cylindrical main body 65 and a cleaning head 66 connected to the lower surface of this main body 65. A path 67 for the passage of distilled water is formed in the main body 65. The cleaning head 66 comprises a permeable cylindrical core member 68 having an internal cavity supplied with distilled water from the distilled water supply path 60, a cylindrical synthetic resin sheet 69 that forms a film over the outer surfaces of the core member 68, and a cylindrical pressure ring 70 that prevents the removal of the resin sheet 69.

For the material of the core member 68, it is preferable to use a synthetic resin which is capable of retaining a predetermined shape without deformation, even when subjected to increased water pressures when the distilled water is supplied thereto, which has components that do not dissolve in the distilled water, and which can be machined or reshaped as necessary both freely and simply. A typical example of such a synthetic resin is polyethylene. In the embodiment shown in these figures, the core member 68 is formed to have a circular cylindrical shape, an aperture portion 71 is formed on the upper surface thereof, and a planar portion 72 is formed on a surface thereof that faces the wafer W, in other words, on the lower surface thereof. The configuration is such that, when distilled water is supplied from the distilled water supply path 60, the core member 68 causes the distilled water to permeate the resin sheet 69 without any deformation or dissolving. The material of the core member would of course have similar requirements if a chemical were to be used as the cleaning liquid.

The resin sheet 69 is attached to the outer surfaces of the core member 68 in such a manner that the resin sheet 69 cannot be removed readily from the outer surfaces of the core member 68. This attachment is done by thermal fusing, to ensure that the resin sheet 69 is attached firmly to the outer surfaces of the core member 68. The attachment method could equally well use adhesive (one that has a contact adhesive component that will not dissolve in distilled water) to attach the resin sheet 69 to the outer surfaces of the core member 68, or pressure adhesion of the resin sheet 69 onto the outer surfaces of the core member 68, by way of example.

A porous type resin is used for the material of the resin sheet 69, making it possible to ensure that the coefficient of friction of the surface thereof is low, so that it is difficult for particles to be generated therefrom by abrasion, in which is formed a large number of tiny holes such that distilled water can be expelled therethrough. This resin could be a fluorocarbon resin or polyolefin resin, by way of example. A more specific example would be a sheet of polytetrafluoroethylene (PTFE) of a thickness of 0.1 mm to several mm, with pores of a size in the order of 0.01 $\mu$m to several hundred $\mu$m. A porous synthetic resin sheet can be obtained by a method such as uniaxial orientation of a synthetic resin. Thus the resin sheet 69 functions as a permeable, porous film which is difficult to abrade and can be used for a long time.

A distilled water supply nozzle 80 (FIG. 3) that can reciprocate freely through an arc $\theta'$ in FIG. 2 is disposed in the substrate cleaning unit 7 at a position that is symmetrical with respect to the scrub cleaner device 25, with the spin chuck 22 therebetween. A nozzle 82 is attached to a far end of an arm 81 of the distilled water supply nozzle 80, with the configuration being such that distilled water is supplied from this nozzle 82.

The description now turns to the process of cleaning a wafer W that is performed by the cleaning apparatus 1 provided with the above described substrate cleaning unit 7.

First of all, a conveyor robot (not shown in the figures) mounts a carrier C containing a number of wafers W that have not yet been cleaned, such as 25 wafers, on the mounting section 2. The wafers W are removed one-by-one from the carrier C that has been mounted on this mounting section 2 and are transferred to the conveyor arm 4 via the extraction/storage arm 3. The substrate cleaning unit 7 and the substrate cleaning unit 8 are used to clean the wafers W one-by-one to remove particles of contaminants that are adhering to the front and rear surfaces of the wafers W. The wafers W that have completed the predetermined cleaning process are transferred from the conveyor arm 4 to the extraction/storage arm 3, and are stored once more in the carrier C.

In this case, the description concerns the cleaning done by the substrate cleaning unit 7. The wafer W is rotated by the spin chuck 22. At the same time, the arm 26 in the scrub cleaner device 25, which is at the standby position shown in FIG. 2, is swiveled about the axis of the shaft 27, to move the cleaning tool 24 to above the wafer W, such as a position in the vicinity of the center of the wafer W. The cleaning tool 24 is then pressed against the surface of the wafer W as shown in FIG. 11 by the operation of the air bearing cylinder 30, while distilled water is supplied through the distilled water supply path 60, and cleaning is performed by the relative motion between the wafer W and the cleaning tool 24. The surface of the wafer W is cleaned uniformly by means such as reciprocal motion of the arm 26 from the center to the periphery of the wafer W. The distilled water supplied through the distilled water supply path 60 passes though the fine pores formed in the core member 68 and the resin sheet 69 and is blown out onto the wafer W where it forms a liquid film 83 on the surface of the wafer W. If necessary, the distilled water supply nozzle 80 can also be moved over the wafer W, to supply distilled water to the surface of the wafer W.

When the cleaning tool 24 is placed into contact with the surface of the wafer W, a predetermined contact force of, for example, 60 gf is applied thereby to the surface of the wafer W. In this case, the pressure of the cleaning tool 24 is adjusted to obtain the predetermined contact force. If the weight of the cleaning tool 24 is assumed to be approximately 100 gf and an upward driving force of 80 gf is applied to the rod 31, by way of example, the contact pressure of the cleaning head 66 can be adjusted to be 20 gf.

During this time, distilled water is being constantly expelled from the surface of the cleaning head 66 so that there is no need to worry about particles adhering to the surface of the cleaning head 66 (in other words, to the surface of the resin sheet 69). There is therefore no need to worry about the particles penetrating into the resin sheet 69, and there is also no problems with particles adhering to the resin sheet 69 becoming transferred to the wafer W, thus contaminating the wafer W.

Moreover, the coefficient of friction of the surface of a resin sheet 69 made of PTFE is low, so that the force of adhesion between the surface of the resin sheet 69 and the particles is low, thus making it difficult for particles to adhere firmly. Note that, since PTFE is strongly resistant to chemicals, various chemicals such as ozone water, electrolytic ionized water, hydrochloric acid, ammonia water, phosphoric acid solution, sulfuric acid solution, or hydrofluoric acid solution can be used as the cleaning liquid, by way of example, which makes it possible to increase the cleaning effect thereof.

Because the resin sheet 69 is placed into contact with the wafer W in a state in which the liquid film 83 has been formed on the surface of the wafer W by the expelled distilled water, it is possible to smooth the contact between the resin sheet 69 and the wafer W. This ensures that no damage is imparted to the wafer W. The resin sheet 69 (the cleaning tool 24) can be placed into indirect contact with the wafer W, with the liquid film 83 therebetween, as shown specifically in FIG. 12, and this indirect contact ensures that the contact between the resin sheet 69 and the wafer W is smoother. Since the core member 68 is covered by the resin sheet 69, there is no need to worry about the resin sheet 69 becoming deformed by factors such as the supply pressure of the distilled water, and the predetermined shape of the resin sheet 69 can be maintained constantly. Since the contact between the resin sheet 69 and the wafer W is smoothed, there is no destruction of the shape thereof due to friction or other factors, even when the number of cleaning cycles increases. It is therefore possible to maintain the initial contact pressure without any bias or "quirks" in the cleaning tool 24.

Furthermore, the resin sheet 69 that covers the planar portion 72 formed in the core member 68 can be placed in surface contact with the wafer W. This makes it possible to increase the contact area with respect to the wafer W and thus prevent the application of excessive contact pressure on specific locations of the wafer W, thus making it possible to perform satisfactory cleaning without damaging the wafer W by scratching it.

Figure 12:
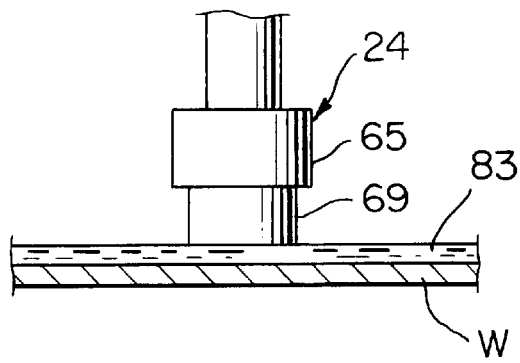
FIG. 12 illustrates a state when the cleaning tool is placed in indirect contact with the surface of the wafer, with a film of distilled water therebetween.

The planar surface portion of the cleaning tool 24 that faces the wafer W, as shown in FIG. 12, moves in a relative manner through the liquid film 83, while operating so as to press against the liquid film 83 on top of the wafer W. As the relative speed of movement of the cleaning tool 24 and the liquid film 83 increases, the thickness of the liquid film 83 decreases. This is similar to the phenomenon that the liquid film 83 on top of the wafer W becomes thinner as the rotational speed of the wafer W increases.

Ultrasonic waves from the ultrasonic wave generation elements 62 are generated in the distilled water that passes through the distilled water supply path 60, as shown in FIG. 9, and the distilled water is expelled from the distilled water supply path 60 in a state in which it is being agitated by these ultrasonic waves. Supplying distilled water that has been agitated in this manner to the surface of the wafer W makes it possible to increase the cleaning effectiveness, in comparison with a supply of distilled water that has not been so agitated.

Before the cleaning tool 24 is placed into contact with the surface of the wafer W, a measurement sensor 44 or the like is used to preset the predetermined contact pressure of the cleaning tool 24 that will be used during the cleaning. When the cleaning tool 24 is placed in contact with the surface of the wafer W, the pressure of the cleaning tool 24 is adjusted to the predetermined contact pressure by the control unit 43 and the electropneumatic regulator 42, so that the wafer W can be cleaned at that predetermined contact pressure.

In this embodiment, the cleaning tool 24 is not made to rotate, as it does in the prior art. Moreover, the air bearings 45 and 46 within the air bearing cylinder 30 of FIG. 6 are used to support the action of the rod 31, so there is no sliding resistance. It is therefore possible to control the contact pressure of the cleaning tool 24 in a simple manner. Since it is not necessary to provide any mechanism for rotating the cleaning tool 24, such as a motor, the number of components of the substrate cleaning unit 7 can be reduced, the configuration can be simplified, and the assembly can be simplified and made less expensive.

The above description concerned only one embodiment of the present invention, but this invention is not limited thereto and it can thus be implemented in various different forms. For example, the formation of the liquid film 83 on the upper surface of the wafer W, as shown in FIG. 3, may be performed by supplying distilled wafer onto the surface of the wafer on the spin chuck 22 by means of the cleaning tool 24 and by separately supplying distilled wafer onto the surface of the wafer W by means of nozzles 29 that are provided substantially in radial directions of the spin chuck 22 and in the neighborhood of the spin chuck 22, as shown in FIG. 2. The nozzles 29 are provided outside the cup 23 at a height higher than the cup 23 so that the nozzles 29 can supply distilled water onto the upper surface of the wafer W as indicated by the arrows. Thus, it is possible to supply a sufficient amount of cleaning liquid. It is preferable that distilled wafer is first supplied from the nozzles 29 onto the upper surface of the wafer W to wet the surface and then the cleaning tool 24 is moved toward the surface of the wafer W while supplying distilled wafer as well from the cleaning tool 24, to thereby form the liquid film 83 on the wafer W. In FIG. 2, two nozzles 29 are provided mainly for 8-inch wafers but only one nozzle 29 suffices for 6-inch wafers.

The material of the resin sheet 69 is not limited to the previously mentioned PTFE and thus any porous material having holes of a size of several $\mu$m to several tens of $\mu$m and having anti-static properties, such as polyolefin resin, can be used therefore.

PTFE that has been impregnated with alcohol to make it hydrophilic can be used as the resin sheet 69. In such a case, the resin sheet 69 becomes hydrophilic, making it easier for the distilled water to pass through the tiny holes of the resin sheet 69. The holes in the resin sheet 69 are so small that, even if there are particles mixed into the distilled water passing within the distilled water supply path 60, those particles do not exit to the outside of the resin sheet 69 to contaminate the wafer W.

On the other hand, water-repellent processing could be applied to PTFE to produce a water-repellent (hydrophobic) resin sheet 69. In such a case, the resin sheet 69 becomes water-repellent, making it possible to repel particles that have been removed from the wafer W by the cleaning, together with the distilled water. This makes it possible to prevent adhesion of particles to the resin sheet 69, even more reliably.

Instead of the air bearing cylinder 30, it is possible to provide an elevational driving mechanism consisting of structural components such as springs, motors, and moving coils, so that a vertical driving force can be applied to the cleaning tool 24 by this elevational driving mechanism, thus pressing down on the cleaning tool 24.

Figure 13:
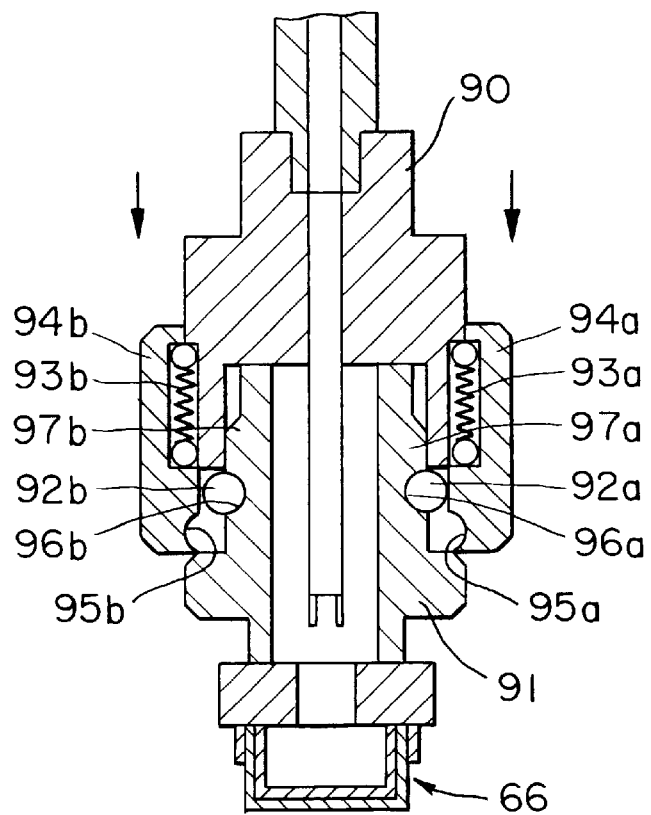
FIG. 13 is a vertical section taken through another example of the attachment tool that is configured to be freely attached or removed with respect to the lower member, illustrating a state in which the attachment tool is attached to the lower member.

In the previously described embodiment of this invention, the attachment tool can be freely attached or removed with respect to the lower member by means of a screw-thread structure, but the configuration could also be such that an attachment tool 91 can be attached and removed with respect to a lower member 90 by the structure shown in FIGS. 13 and 14 (called a coupler structure). First of all, one side of the lower member 90 is provided with a ball 92*a* that prevents any falling of the attachment tool 91 when the attachment tool 91 is fixed with respect to the lower member 90 and a shiftable member 94*a* that is held in a vertical orientation by a coil spring 93*a*, and a concave portion 95*a* into which the ball 92*a* can enter is formed at a lower portion of the shiftable member 94*a*. Similarly, the other side of the lower member 90 is provided with a ball 92*b*, a coil spring 93b, and a shiftable member 94b, and a concave portion 95b is formed at a lower portion of the shiftable member 94b. On one side of the attachment tool 91 are formed a concave portion 96a into which the ball 92a can enter and a protruding portion 97a above this concave portion 96a, and on the other side of the attachment tool 91 are formed a concave portion 96b and a protruding portion 97b, in a similar manner.

When the attachment tool 91 is to be fixed to the lower member 90, the shiftable members 94a and 94b are raised by means such as by hand, in a state in which the ball 92a is within the concave portion 95a and the ball 92b is within the concave portion 95b, as shown in FIG. 14, and the attachment tool 91 is inserted into the lower member 90. If the hand is subsequently removed, as shown in FIG. 13, the resiliency of the coil springs 93a and 93b forces the shiftable members 94a and 94b downward. During this time, the ball 92a enters the concave portion 96a and the ball 92b enters the concave portion 96b, and the balls 92a and 92b are sandwiched between the lower member 90 and the attachment tool 91. In this case, the protruding portion 97a hits the ball 92a and the protruding portion 97b hits the ball 92b so that the attachment tool 91 cannot separate from the lower member 90. If the shiftable members 94a and 94b are raised again, as shown in FIG. 14, the ball 92a moves into the concave portion 95a and the ball 92b moves into the concave portion 95b, and thus the attachment tool 91 can be removed in a simple manner from the lower member 90. Depending on the mechanism involved, it is possible to exchange the cleaning tool 24 in a simple manner.

Alternatively, as shown in FIGS. 15 to 17, a head portion 102 of a cleaning tool 100 could be configured to be freely attached or removed with respect to a main body 101, where the cleaning tool 100 is also provided with a threaded portion 103 on an upper surface of the main body 101, to enable the cleaning tool 100 to be freely attached or removed with respect to an attachment tool. FIGS. 15 to 17 illustrate first to third steps in the process of attaching the head portion 102 to the main body 101. As shown in FIG. 15, the configuration is such that an O-ring 104 is provided at an upper end portion of the head portion 102, an outer groove 105 corresponding to the radially-extending O-ring 104 is formed in a lower portion of the main body 101, and the head portion 102 is attached to the main body 101 in a tightly-sealed state. The head portion 102 is fitted over the outer side of the lower portion of the main body 101, as shown in FIG. 16, then is tightened by a clip-ring 106 around the O-ring 104, as shown in FIG. 17. The cleaning tool 100 can then be attached by screwing it by the threaded portion 103 into the attachment tool. This configuration makes it possible to simply remove the cleaning tool 100 from the attachment tool and replace the head portion 102 alone, when the cleaning tool 100 has reached the end of its design life.

In addition, the core member and the head portion of the cleaning tool can be modified in many ways, as will be described below with reference to specific modifications of the cleaning tool. For example, the thickness of the core member can be freely modified. A core member that is thinner that the previously described core member 68 could be provided within the head portion 66, by way of example. A configuration is also possible in which a core member 111 having inner and outer double walls defining a hollow annular space therebetween is provided within the head portion 66, as in a cleaning tool 110 in accordance with a first modification shown in FIG. 18. The inner and outer walls of the core member 111 may be of different thicknesses, different materials, different permeabilities for liquid, etc. The diameters of the inner and outer walls may be designated appropriately. Thus, liquid pressure can be controlled and particles in the liquid can be shut off to thereby prevent supply of liquid containing particles onto the wafer. On the other hand, a head member that is thicker than the core member 68 could be provided within the head portion 66.

It is also possible to provide a solid core member 113 of a substantially circular cylindrical shape within the head 66, as in a cleaning tool 112 in accordance with a second modification shown in FIG. 19. The permeation speed of the distilled water, and thus the amount of distilled water that is expelled, can be freely adjusted by varying the thickness of this type of core member.

A cleaning tool 115 shown in FIG. 20 is a third modification that is an improvement on the cleaning tool 112. As shown in this example, a plurality of passageways 116 are formed in the core member 113, whereby the distilled water that has passed through the passageways 116 on the lower surface of the head 66 can be readily guided. In this case, the width of each of the passageways 116 is preferably on the order of 0.2 mm, by way of example. In the example shown in this figure, the passageways 116 are formed to be linear in the vertical direction, but this embodiment is not limited thereto and the shape of the passageways 116 may be curved or they may be inclined at an angle. It is possible to freely adjust the amount and pressure of the expelled distilled water by modifying the dimensions and shape of the passageways 116 in this manner.

The description now turns to fourth to eighth modifications of the cleaning tool, with reference to FIGS. 21 to 28. A cleaning tool 120 of a fourth modification shown in FIG. 21 has a tapered surface 121 formed around the lower peripheral edge thereof. A tapered surface 125 is formed around the periphery of a planar surface 124 of a head 122 of this cleaning tool 120, and the previously mentioned tapered surface 121 is formed in the core member 123 by covering that structure with a resin sheet 126. The width L of the tapered surface 121 is preferably no more than 1 mm, by way of example. If the wafer W is held by a mechanical chuck and the above tapered surface 121 is formed, it is possible to ensure that chuck members such as claws or rings do not catch in the head 122.

A cleaning tool 130 of a fifth modification shown in FIG. 22 has a configuration such that a curved tapered surface 131 is formed in a convex arcuate shape on the outer side of the lower peripheral edge thereof, and a corner portion is removed from the lower peripheral edge. In a head 132 of this cleaning tool 130, a curved surface 135 is formed in a convex arcuate shape on the outside of the peripheral edge of a planar portion 134 at the lower portion of a core member 133, and the previously mentioned tapered surface 131 is formed in the core member 133 by covering that structure with a resin sheet 136. In this case too, it is preferable that the width L is no more than 1 mm, by way of example.

The tapered surface 121 of the head 122 of the cleaning tool 120, or the convex arcuate surface 131 of the head 132 of the cleaning tool 130, makes it easy for the cleaning liquid to intrude between it and the wafer W, thus enabling an increase in the cleaning effect. In addition, the contact pressure of each of these cleaning tools 120 and 130 can be controlled easily.

A cleaning tool 140 of a sixth modification shown in FIGS. 23 and 24 has a head 141 formed in a truncated circular conical shape. A planar portion 143 is formed on the lower surface of a core member 142 of the head 141, as shown in FIG. 24, and the left and right side surfaces of the vertical sectional form of the core member 142 are inclined. The thus configured core member 142 is covered by a resin sheet 144.

Figure 25:
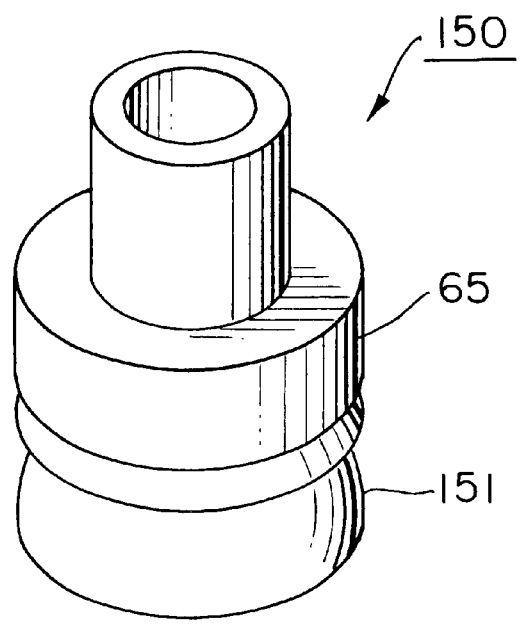
FIG. 25 is a perspective view of a seventh modification of the cleaning tool.
Figure 26:
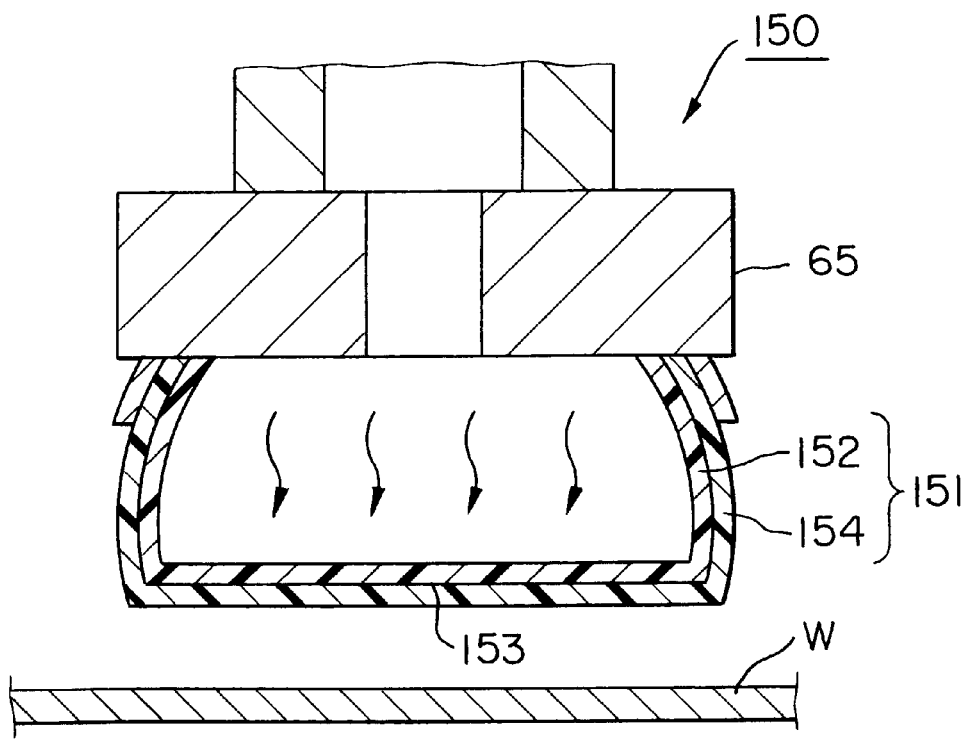
FIG. 26 is a vertical section taken through the seventh modification of the cleaning tool.

A cleaning tool 150 of a seventh modification shown in FIGS. 25 and 26 has a head portion 151 with a side surface that curves outward in a convex arcuate shape. A planar portion 153 is formed on the lower surface of a core member 152 of the head 151, as shown in FIG. 26, and the peripheral side surface of the vertical sectional form of the core member 152 is curved outward in a convex arcuate shape. The thus configured core member 152 is covered by a resin sheet 154. Each of these cleaning tools 140 and 150 enables a surface contact with the wafer W, in a similar manner to the cleaning tool 24.

In the embodiments described with reference to FIGS. 23 to 26, cross section of the head portions 141 and 151 in parallel with the planar portions 143 and 153 facing the wafer W gradually varies in shape and dimensions. Such configuration of the head portion enables that the area of the planar portion 141 or 153 is changed as desired while the dimensions of the base part of the head portion to be attached to the main body 65 of the cleaning tool are maintained unchanged. Consequently, it becomes possible to interchangeably mount head portions having a variety of areas of the planar portion 143 or 153 to the same main body 65 of the cleaning tool (for example, the greater the area of the planar portion, the shorter is the cleaning time with resultant change of cleaning performance). This makes it unnecessary to design and manufacture different cleaning tool main body 65 to make the main body 65 match different head portions having different areas of the planar portion.

Figure 27:
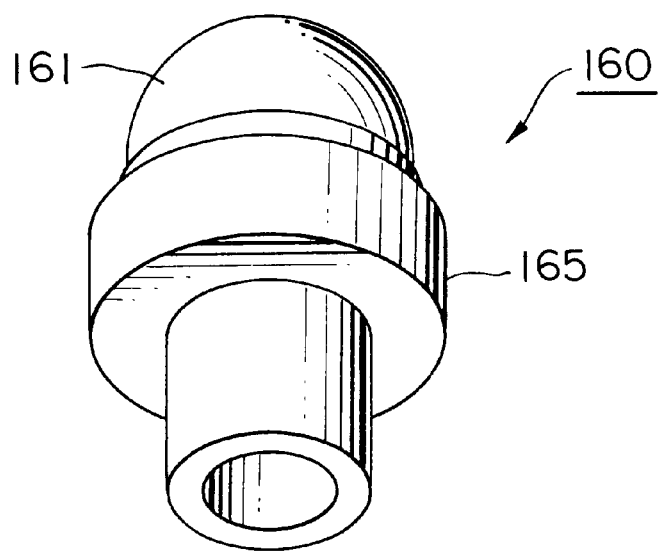
FIG. 27 is a perspective view of an eighth modification of the cleaning tool.
Figure 28:
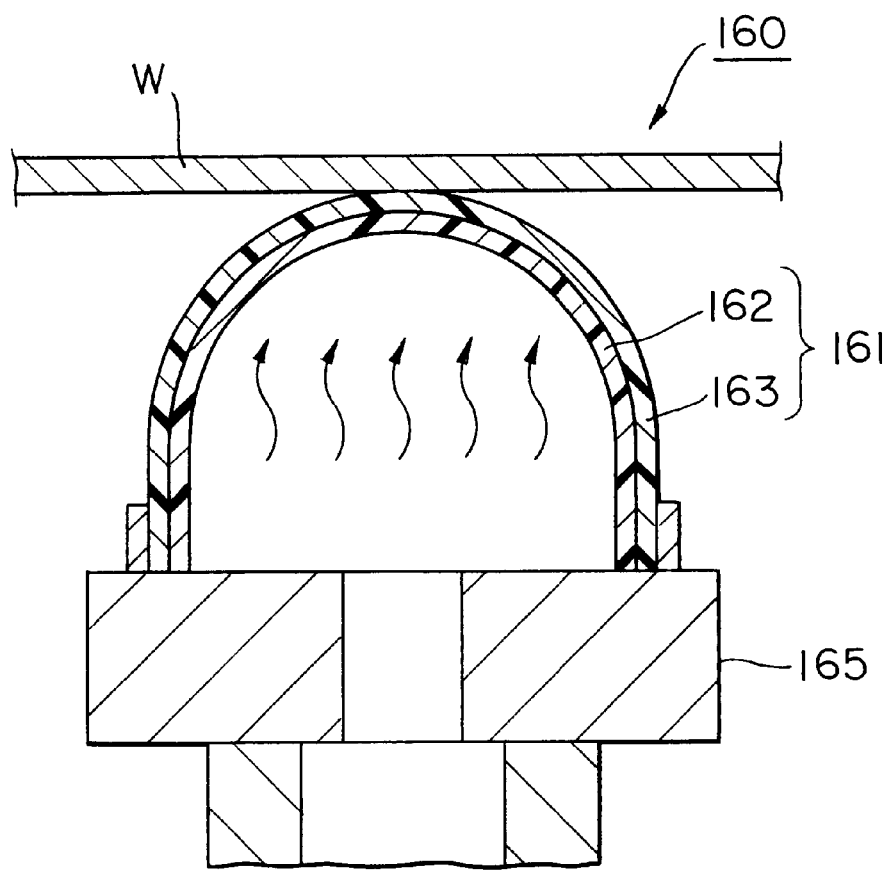
FIG. 28 is a vertical section taken through the eighth modification of the cleaning tool.
Figure 29:
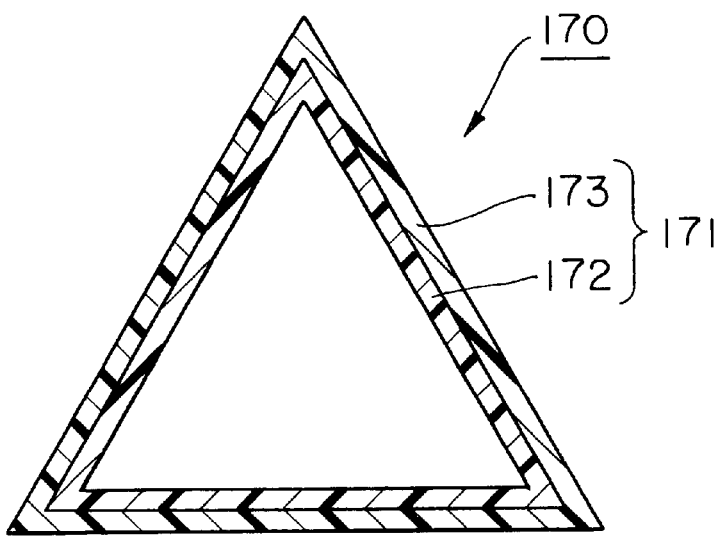
FIG. 29 is a lateral section taken through a ninth modification of the cleaning tool.

A cleaning tool 160 of an eighth modification shown in FIGS. 27 and 28 has a head 161 with an end portion that is substantially dome-shaped. The vertical sectional form of a core member 162 of the head 161 is formed into an approximately hemispherical shape, and the outer surface of this core member 162 is covered by a resin sheet 163. In the example shown in FIG. 28, the tool is placed into contact with the wafer W so that the lower surface of the resin sheet 163 is pressed. The thus-configured cleaning tool 160 is effective for cleaning the rear surface of wafer W, on which no semiconductor devices are formed. Use of the thus-configured cleaning tool 160 when the rear surface of the wafer W is contaminated makes it possible to press the cleaning tool firmly against the rear surface of the wafer W, but to a degree that does not cause damage thereto, making it possible to remove particles from the rear surface of the wafer W by moving the tool relative to the wafer W.

The description now turns to ninth to twelfth modifications of the cleaning tool, with reference to FIGS. 29 to 32. A cleaning tool 170 of a ninth modification shown in FIG. 29 has a head 171 having a horizontal cross-sectional form that is triangle-shaped. The overall shape of the head 171 could be a triangular prism or a triangular cone shape, by way of example. The outer surface of a core member 172 that has been machined in an appropriate manner to obtain the above described shape is covered by a resin sheet 173.

Figure 30:
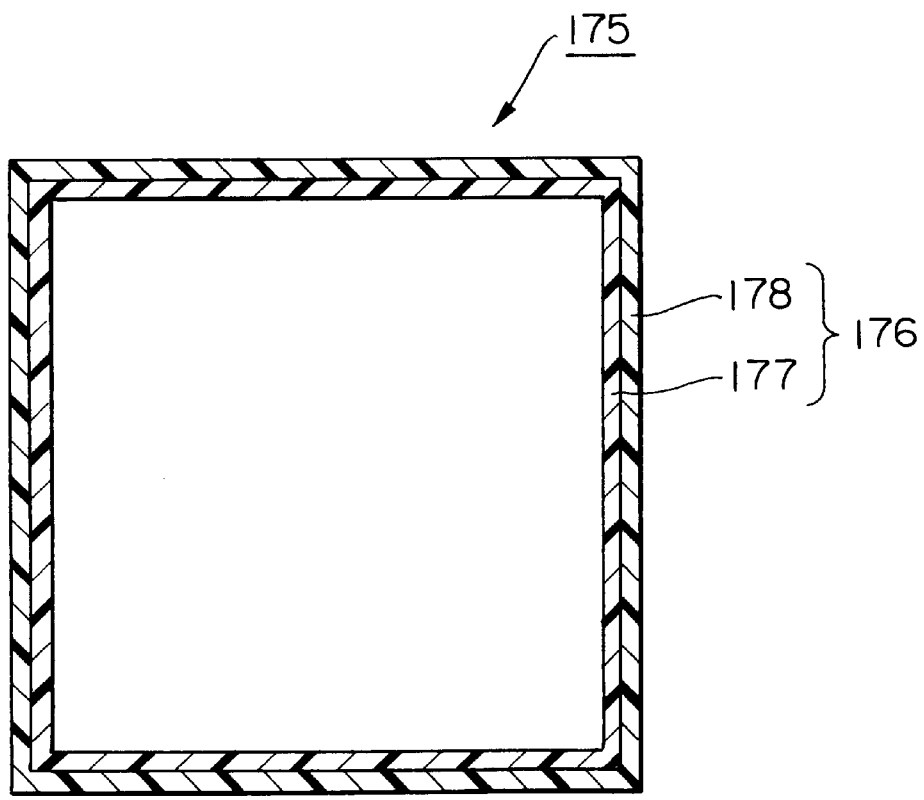
FIG. 30 is a lateral section taken through a tenth modification of the cleaning tool.

A cleaning tool 175 of a tenth modification shown in FIG. 30 has a head 176 having a horizontal cross-sectional form that is square-shaped. The overall shape of the head 176 could be a square prism or a square cone shape, by way of example, and the outer surface of a core member 177 that has been machined in an appropriate manner to obtain the above described shape is covered by a resin sheet 178.

A cleaning tool 180 of a ninth modification shown in FIG. 31 has a head 181 having a horizontal cross-sectional form that is triangle-shaped, where in the three corners thereof are curved outward in a convex form. The outer surface of a core member 182 that has been machined in an appropriate manner to correspond to the head 181 of this lateral cross-sectional form is covered by a resin sheet 183.

A cleaning tool 185 of a twelfth modification shown in FIG. 32 has a head 186 having a horizontal cross-sectional form that is rectangular-shaped. The outer surface of a core member 187 that has been machined in an appropriate manner to correspond to the head 186 of this horizontal cross-sectional form is covered by a resin sheet 187. It is similarly possible to machine a core member to obtain any polygonal cone shape or polygonal prism shape, for the head, and cover the outer surface of the thus-obtained core member with a resin sheet.

As described above, the core member can take many different forms, but since thermal fusion is used to cover the core member with a resin sheet, it is possible to ensure that the resin sheet does cover the core member, even if it has a complicated shape. It is therefore possible to shape the cleaning tool freely. It is desirable to used a cleaning tool of the most optimal shape, depending on the cleaning to be done thereby.

Figure 33:
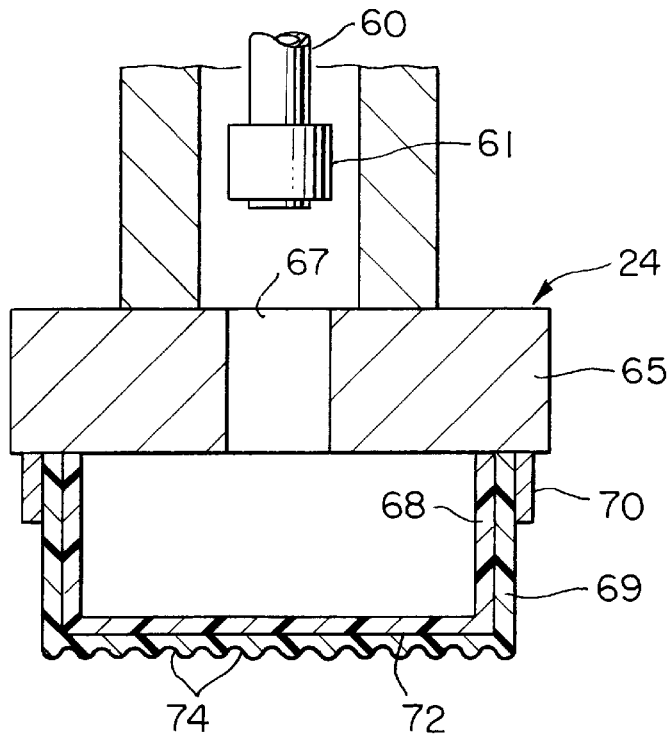
FIG. 33 is a vertical section taken through a further modification of the cleaning tool.
Figure 34:
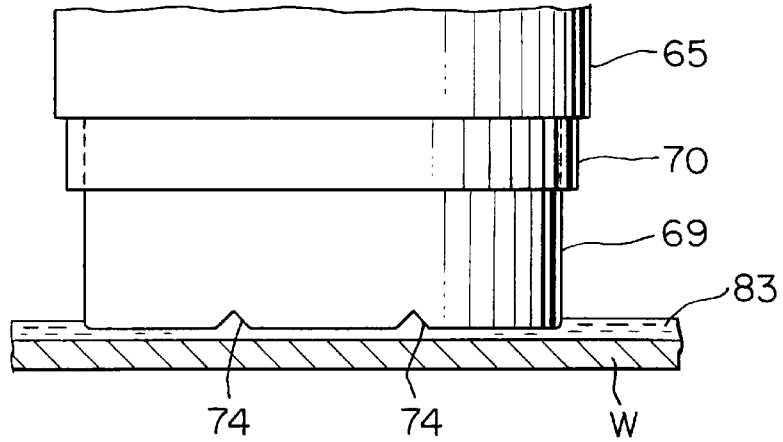
FIG. 34 is a side view of the modification of the embodiment shown in FIG. 33.
Figure 35:
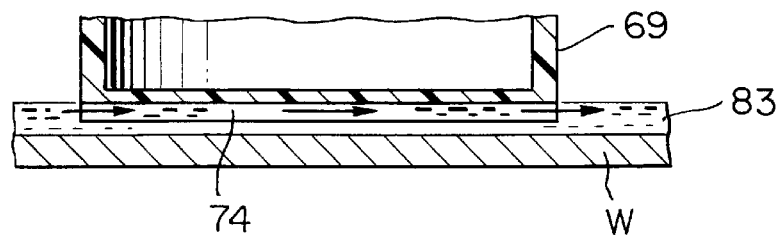
FIG. 35 is illustrative of the usage of the modification shown in FIG. 34.
Figure 36:
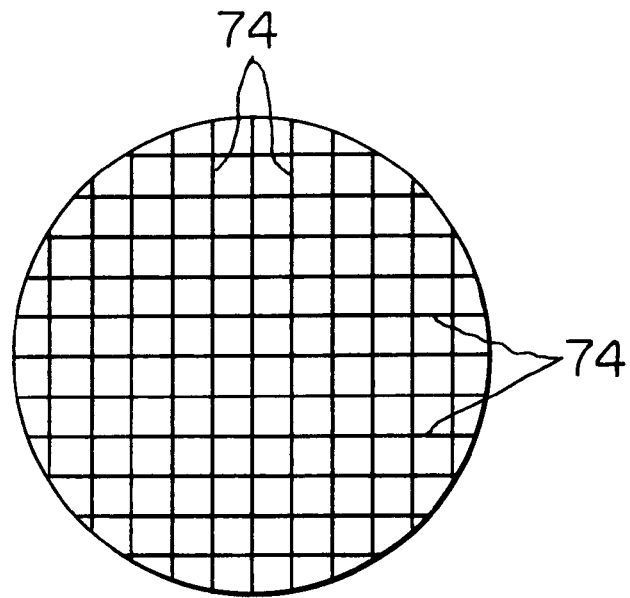
FIG. 36 is a bottom view of an example of grooves in the embodiment of FIG. 33.
Figure 37:
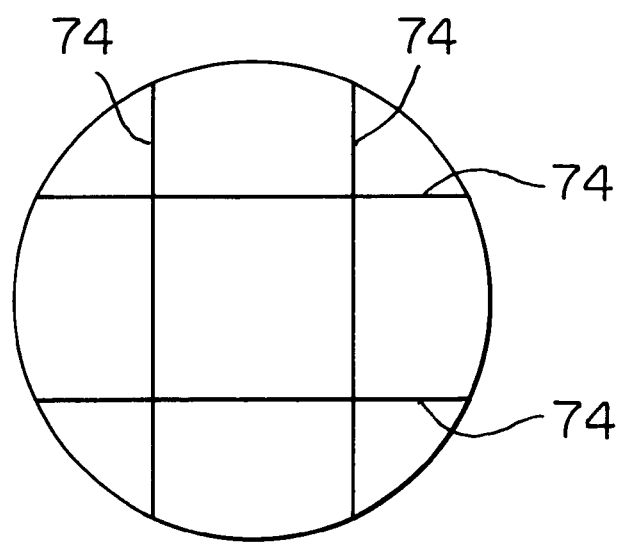
FIG. 37 is a bottom view of another example of grooves in the embodiment of FIG. 33.

The surface of the cleaning tool that faces the wafer W is formed to be flat, except for the example shown in FIG. 28. It has become clear that it is preferable to form grooves in this planar surface of the cleaning tool. An embodiment wherein grooves 74 are formed in the flat surface of the cleaning tool 24 of FIG. 9 is shown in FIG. 33. In the embodiment shown in FIG. 33, the grooves 74 are formed to have a wave-shaped section and are disposed so that a large number of linear grooves are in close vicinity. In another embodiment shown in FIG. 34, a plurality of linear grooves 74 are provided at intervals. The cross-sectional form of the grooves of this embodiment is substantially triangular. The disposition of the grooves 74 on the flat surface could be a fine mesh or grating pattern, as shown in FIG. 36, or a coarse mesh or grating pattern, as shown in FIG. 37. The disposition of the grooves is arbitrary, and thus the disposition could be in many various forms in addition to those shown in FIGS. 36 and 37. The provision of such grooves 74 in the cleaning tool ensures that, when the cleaning tool moves relative to the liquid film 83 on the surface of the wafer W, the liquid within the grooves 74 is guided as it flows in the direction shown by the arrows in FIG. 35. This ensures that the speed of the liquid (wafer) flows increases and the liquid film 83 becomes thin so that particles, which strongly adhere to the wafer and are difficult to remove, are incorporated into the liquid flow (water flow) and thus has the advantage of improving the efficiency of particle removal.

Figure 38:
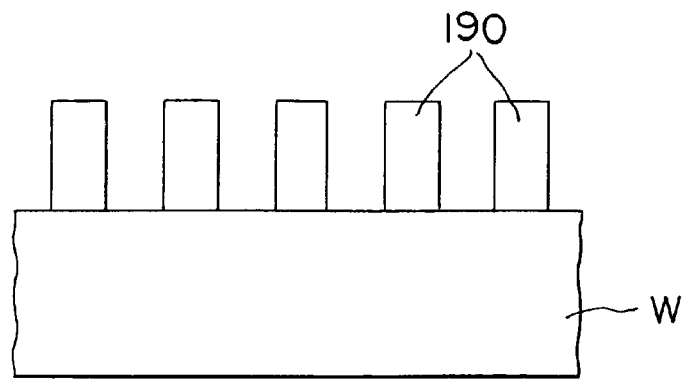
FIG. 38 is an explanatory view of a first step in a process of evaluating damage that has occurred during the cleaning and spin-drying of a wafer.
Figure 39:
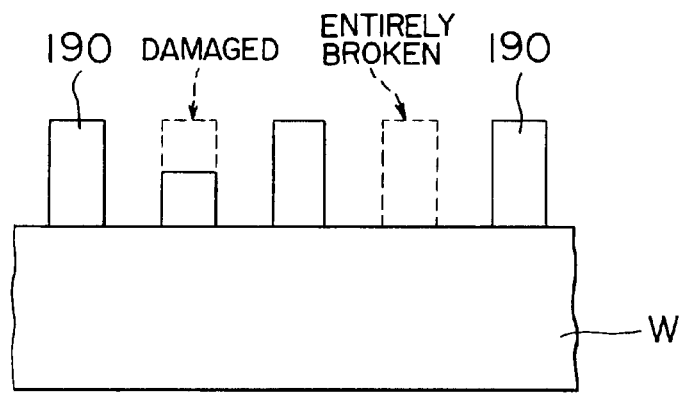
FIG. 39 is an explanatory view of a second step in the process of evaluating damage that has occurred during the cleaning and spin-drying of a wafer.

The description now turns to a method of evaluating damage that occurs during the cleaning and drying of a wafer W. First of all, a predetermined resist pattern 190 is formed on the surface of the wafer W, as shown in FIG. 38. Subsequently, the wafer W is scrubbed by the scrub cleaner device 25 within the substrate cleaning unit 7, as shown in FIGS. 2 and 3, and is then spun to dry it. The surface of the wafer W that has been damaged as shown in FIG. 39 is then inspected with an electro-optical inspection apparatus, by way of example, to measure how much the resist pattern 190 has been partly damaged or entirely broken by the effects of the cleaning and spin-drying.

During this time, various conditions are recorded, such as the type of material of the resin sheet 69, the contact pressure of the cleaning tool 24, the cleaning time, the rotational speed of the wafer W during the cleaning, the amount of cleaning liquid expelled from the cleaning tool 24, the drying time, and the rotational speed of the wafer while it is being spun to dry it, to evaluate the damage to the wafer W during the cleaning and spin-drying in a comprehensive manner.

In the prior art, the damage that occurs during the cleaning and spin-drying is determined from the yield of semiconductor devices, after the fabrication process has ended and the semiconductor devices have been fabricated. Since the process of fabricating semiconductor devices comprises various steps such as film formation and etching, it is obviously impossible to accurately evaluate the damage due to the cleaning and spin-drying of the wafers W from the yield of semiconductor devices. In this case, wafers W with applied resist patterns are used in direct measurements of damage due to cleaning and spin-drying, depending on the method used, making it possible to obtain accurate damage assessments. Moreover, wafers W with applied resist patterns can be created easily, making it possible to obtain data relating to various different types of damage, by performing the damage evaluation while modifying various conditions such as the type of material of the resin sheet 69 or the contact pressure of the cleaning tool 24. Note that this method can not only be used to obtain data relating to the substrate cleaning unit 7; it can also be used to measure fragmentation and damage of the resist pattern 190 during cleaning in the substrate cleaning unit 7 after the wafers W have been heated by the heating devices 9 as pre-processing, or during heating of the wafers W by the heating devices 9 after the cleaning as post-processing, by way of example.

Figure 40:
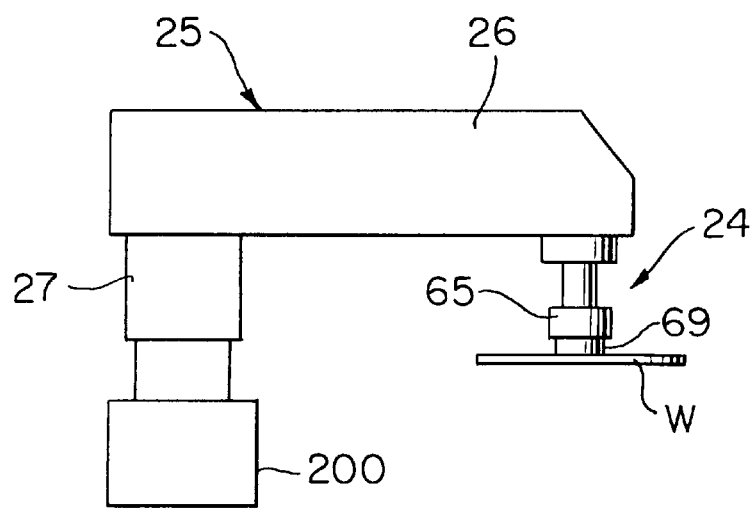
FIG. 40 shows a modification of the cleaning apparatus of FIGS. 3 and 4.

In the embodiment shown in FIGS. 3 and 4, the cleaning tool 24 of the scrub cleaning device 25 is moved vertically relative to the horizontal arm 26 by the operation of the air bearing cylinder 30, to thereby adjust the pressing force of the cleaning tool 24 against the surface of the wafer W. Instead, the pressing force of the cleaning tool 24 against the surface of the wafer W could be adjusted by a modified structure shown in FIG. 40, in which the shaft 27 at the base end of the horizontal arm 26 is mounted on an air cylinder 200 so that the shaft 27 is adjustable in vertical position by means of the air cylinder 200. Vertical adjusting movement of the air cylinder 200 is transmitted to the horizontal arm 26, whereby the horizontal arm 26 is displaced vertically to adjust the pressing force of the cleaning tool 24.

The present invention can also be applied to cleaning processing that is performed after oxide films have been etched by a fluoric acid solution; after nitride films have been etched by a liquid such as a phosphoric acid solution; or after aluminum has been etched by a mixture of phosphoric acid, acetic acid, and nitric acid. In addition, it can also be applied to cleaning processes such as the removal of particles by an APM solution (ammonia, hydrogen peroxide, and distilled water), the removal of metal contaminants by an HPM solution (hydrochloric acid, hydrogen peroxide, and distilled water), and the removal of organic substances from resist films by an SPM solution (nitric acid, hydrogen peroxide, and distilled water).

Furthermore, it is possible to perform the cleaning by placing the cleaning tool into contact with the wafer while rotating the cleaning tool about an axis in the vertical direction, to cause relative motion between the cleaning tool and the wafer. The substrate is also not limited to the wafer cited in the above described embodiments; it could equally well be an LCD substrate, a CD substrate, a printed substrate, or a ceramic substrate.

As described above, the present invention makes it possible to prevent contamination and damage of a substrate and also makes it possible to constantly retain the predetermined shape of the substrate cleaning tool. It is therefore possible to maintain the initial contract pressure and clean the substrate in a satisfactory manner.

The present invention also makes it possible to increase the contact area with respect to the substrate and thus prevent the application of excessive pressure on specific locations of the substrate, by forming a flat surface in the surface of the core member that faces the substrate and covering that flat surface with a porous film, thus making it possible to perform satisfactory cleaning without damaging the substrate by scratching it. The property requirements of the core member can also be satisfied.

It is also possible to prevent the porous film from separating from the core member because of the water pressure applied when the cleaning liquid is expelled therethrough, by fabricating the resin sheet of a synthetic resin having a large number of very small holes, thus preventing expansion of the porous film itself.

The porous film can be attached to the core member by thermal fusing or melting and the shape of the substrate cleaning tool can be created freely.

It is also possible to implement various other attributes for the substrate cleaning tool, such as prevention of the adhesion of particles, prevention of contamination of the substrate, favorable chemical resistance characteristics, or a longer lifetime, by making the porous film either hydrophilic or water-repellent.

What is claimed is:

1. A cleaning tool for cleaning a substrate, comprising:
   a cleaning head and a cleaning liquid supply path for supplying a cleaning liquid into said cleaning head;
   said cleaning head including:
      a permeable and cylindrical core member for receiving said supply of cleaning liquid from said cleaning liquid supply path; and
      a permeable porous film fixedly covering and in contact with substantially all of an outer surface of said core member.

2. The cleaning tool as defined in claim 1, wherein said core member comprises a surface facing a substrate, said surface is formed to be a planar surface, and said planar surface is covered by said porous film.

3. The cleaning tool as defined in claim 1, wherein said core member has a large number of very small holes.

4. The cleaning tool as defined in claim 2, wherein said planar surface is formed at an end portion of said cylindrical portion of said core member.

5. The cleaning tool as defined in claim 4, wherein cross section of said cylindrical portion of the cleaning head in parallel with the planar surface facing the substrate is polygonal-shaped or circular-shaped.

6. The cleaning tool as defined in claim 4, wherein a boundary portion between said cylindrical portion and said planar portion of said cleaning head is a tapered surface.

7. A cleaning tool for cleaning a substrate, comprising:
   a cleaning head and a cleaning liquid supply path for supplying a cleaning liquid into said cleaning head;
   said cleaning head including:
      a permeable core member for receiving said supply of cleaning liquid from said cleaning liquid supply path; and
      a permeable porous film covering an outer surface of said core member, wherein said permeable core member has double cylindrical peripheral walls defining a hollow space therebetween.

8. The cleaning tool as defined in claim 1, wherein said permeable core member is configured of a porous solid member.

9. The cleaning tool as defined in claim 8, wherein a cleaning liquid passage is formed in said porous solid member.

10. The cleaning tool as defined in claim 1, wherein said permeable porous film is formed of a synthetic resin.

11. The cleaning tool as defined in claim 10, wherein said resin of said permeable porous film is a hydrophilic resin.

12. The cleaning tool as defined in claim 10, wherein said resin of said permeable porous film is a hydrophobic resin.

13. The cleaning tool as defined in claim 1, further comprising grooves formed in said surface of the permeable porous film, facing the substrate.

14. A cleaning apparatus for cleaning a substrate, comprising:
 a cleaning tool, a support member for supporting said cleaning tool, and a pressing mechanism for pressing the cleaning tool to the substrate; wherein:
  said cleaning tool includes a cleaning head and a cleaning liquid supply path for supplying a cleaning liquid into said cleaning head; and
  said cleaning head includes:
   a permeable and cylindrical core member for receiving said supply of cleaning liquid from said cleaning liquid supply path; and
   a permeable porous film fixedly covering and in contact with substantially all of an outer surface of said core member.

15. The cleaning apparatus as defined in claim 14, wherein said cleaning tool is supported by said support member through said pressing mechanism.

16. The cleaning apparatus as defined in claim 14, wherein said core member comprises a surface facing a substrate, said surface is formed to be a planar surface, and said planar surface is covered by said porous film.

17. The cleaning apparatus as defined in claim 16, wherein said planar surface is formed at an end portion of said cylindrical portion of said core member.

18. The cleaning apparatus as defined in claim 14, wherein said core member has a large number of tiny holes.

19. The cleaning apparatus as defined in claim 14, wherein said pressing mechanism includes a pneumatic mechanism.

20. The cleaning apparatus as defined in claim 14, wherein said cleaning liquid supply path has an ultrasonic wave generator for imparting ultrasonic wave oscillations to a cleaning liquid passing therethrough.

21. The cleaning apparatus as defined in claim 14, wherein said cleaning tool is supported on said support mechanism in a detachable manner.

* * * * *